United States Patent
Komoriya et al.

(10) Patent No.: US 8,592,508 B2
(45) Date of Patent: Nov. 26, 2013

(54) TOP COAT COMPOSITION

(75) Inventors: Haruhiko Komoriya, Iruma-gun (JP); Shinichi Sumida, Kawagoe (JP); Kenjin Inomiya, Fujimino (JP); Takashi Mori, Fujimino (JP); Takamasa Kitamoto, Asaka (JP); Yusuke Kanto, Fujimino (JP)

(73) Assignee: Central Glass Company, Limited, Ube-shi (JP)

( * ) Notice: Subject to any disclaimer, the term of this patent is extended or adjusted under 35 U.S.C. 154(b) by 170 days.

(21) Appl. No.: 13/139,641

(22) PCT Filed: Dec. 11, 2009

(86) PCT No.: PCT/JP2009/070725
§ 371 (c)(1),
(2), (4) Date: Jun. 14, 2011

(87) PCT Pub. No.: WO2010/071081
PCT Pub. Date: Jun. 24, 2010

(65) Prior Publication Data
US 2011/0245395 A1 Oct. 6, 2011

(30) Foreign Application Priority Data
Dec. 15, 2008 (JP) ................. 2008-319028

(51) Int. Cl.
*C09D 133/16* (2006.01)

(52) U.S. Cl.
USPC ............ 524/379; 524/544; 526/242; 526/346

(58) Field of Classification Search
USPC ........................... 524/379, 544; 526/242, 346
See application file for complete search history.

(56) References Cited

U.S. PATENT DOCUMENTS

| | | | |
|---|---|---|---|
| 6,136,499 A * | 10/2000 | Goodall et al. | 430/270.1 |
| 8,053,161 B2 * | 11/2011 | Wada et al. | 430/270.1 |
| 2005/0250898 A1 | 11/2005 | Maeda et al. | |
| 2006/0029884 A1 | 2/2006 | Hatakeyama et al. | |

FOREIGN PATENT DOCUMENTS

| JP | 2002-072484 | * | 3/2002 |
|---|---|---|---|
| JP | 2004-083900 | * | 3/2004 |
| JP | 2005-213215 | * | 8/2005 |
| JP | 2005-316352 A | | 11/2005 |
| JP | 2005-321765 | * | 11/2005 |
| JP | 2006-70244 A | | 3/2006 |
| JP | 2008-203452 A | | 9/2008 |

OTHER PUBLICATIONS

M. Switkes, et al., "Resolution Enhancement of 157nm Lithography by Liquid Immersion", Proceedings of SPIE, 2002, pp. 459-465, vol. 4691, USA.
2nd Immersion Work Shop, Resist and Cover Material Investigation for Immersion Lithography, Jul. 11, 2003—(Four hundred nineteen (419) pages).
Basil S. Farah, et al., "Perhalo Ketones. VII. Phenolic Derivatives of the Perhaloacetones", J, Org. Chem., 1965, pp. 1003-1005, vol. 30, No. 4.
PCT/ISA/237 Form (Three (3) pages), Apr. 2007 for PCT/JP2009/070725.
International Search Report including English translation dated Jan. 12, 2010 (Five (5) pages).

* cited by examiner

*Primary Examiner* — Peter D. Mulcahy
*Assistant Examiner* — Henry Hu
(74) *Attorney, Agent, or Firm* — Crowell & Moring LLP

(57) ABSTRACT

Disclosed is a top coat composition for photoresist, which is characterized by containing a fluorinated polymer having a repeating unit represented by general formula (5).

[Chemical Formula 31]

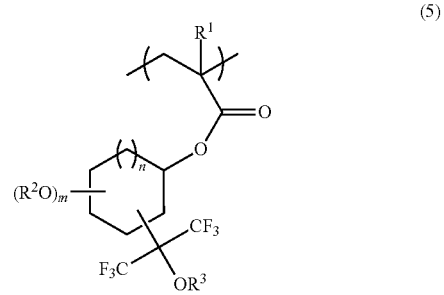

(5)

In the formula, $R^1$ represents a hydrogen atom, a methyl group, a fluorine atom, or a trifluoromethyl group; n represents 0 or 1; m represents an integer of 1 to (3+n); and $R^2$ or $R^3$ represents a hydrogen atom or a protecting group. The top coat composition has a proper degree of solubility in a developing solution.

8 Claims, No Drawings

TOP COAT COMPOSITION

TECHNICAL FIELD

The present invention relates to a top coat composition for photoresist, containing a fluorinated polymer having a specified repeating unit. This top coat composition is useful particularly as a protecting film used in immersion exposure process.

BACKGROUND OF THE INVENTION

Fluorine-based compounds are developed or used in wide applied fields of advanced materials, by virtue of characteristics of fluorine such as water repellency, oil repellency, low water absorption, heat resistance, weatherability, corrosion resistance, transparency, photosensitivity, low refractive index, and low dielectric property. In recent years in particular, resist materials employing fluorine-based compounds have actively been studied as novel materials that are highly transparent to short wavelength ultraviolet rays emitted by an $F_2$ laser or ArF laser. A common molecular design in these applied fields is based on various performances such as photosensitivity using acid characteristics of fluoroalcohols having a 1,1,1,3,3,3-hexafluoroisopropyl-2-hydroxyl group (also referred to as a hexafluoroisopropyl hydroxyl group), adhesion to a substrate, and a high hardness, that is, a high glass transition point (Tg), in addition to transparency at each used wavelength due to the introduction of fluorine.

On the other hand, finer resist patterns have been more demanded with microfabrication of a device structure in lithography processes, so that improvements of exposure devices have been increasingly studied.

For example, a stepper (a reduction projection aligner) has been dramatically improved in resolution performance by performance improvements of reduction projector lenses and by refinements of optical designs. The performance of lenses used in the stepper is expressed by NA (numerical aperture), and its value of around 0.9 is defined as a physical limit in air but it has already been attained at the present time. With this, it is now on attempt to raise NA to 1.0 or more by filling a space defined between a lens and a wafer with a medium having a larger refractive index than air, in which an exposure technique that adopts an immersion method using pure water (hereinafter, which may be referred to as merely water) in particular as the medium has received attention (Non-Patent Publication 1).

In immersion lithography, various concerns resulted from contact between a resist film and the medium (e.g., water) have been pointed out. Particularly, there are problems such as changes in pattern shape and a pattern collapse due to swelling, which are caused by the water dissolving an acid generated in the film by exposure or an amine compound added as a quencher. In view of this, there is given a report that a topcoat layer disposed on the resist is effective at separating the resist film by water (Non-Patent Publication 2).

Hence a top coat composition is required to exhibit a good developing solution-solubility, resistance to pure water, separability between the resist film and water, and such a performance as not to affect the resist film disposed as underlayer. As a top coat composition satisfying the above-mentioned requirements, a composition that contains a fluorinated polymer formed of a repeating unit including a unit having two or more hexafluoroisopropyl hydroxyl group was developed, and the composition was reported to be excellent in developing solution-solubility in particular (Patent Publication 1).

REFERENCES ABOUT PRIOR ART

Patent Publication

Patent Publication 1: Japanese Patent Application Publication No. 2005-316352

Non-Patent Publication

Non-Patent Publication 1: Proceedings of SPIE Vol. 4691 ((Issuing Country) the U.S.A.) 2002, vol. 4691, pp. 459-465)

Non-Patent Publication 2: 2nd Immersion Work Shop, Jul. 11, 2003, Resist and Cover Material Investigation for Immersion Lithography

SUMMARY OF THE INVENTION

A top coat disposed on a resist film to protect the resist film is required to have such performances as a good developing solution-solubility, resistance to pure water, and separability between the resist film and water. Additionally, a top coat composition used for forming the top coat is required to have a property of not affecting the resist film disposed as underlayer.

In the case where the developing solution-solubility is poor, elimination of a top coat film is not enough so as to deteriorate a photoresist performance, which is therefore not preferable. Contrary to this, the case where the developing solution-solubility is too outstanding raises the possibility of induction of a film-thinning of a resist layer disposed as underlayer. Therefore, one that exhibits a moderate developing solution-solubility is preferable.

A top coat composition set forth in Patent Publication 1 provides a useful top coat excellent in developing solution-solubility; however, this top coat is not always suitable for a case that requires delicately controlling the solubility because its solubility is excessively high, so that a top coat having a moderate developing solution-solubility has been demanded. Since introduction of two hexafluoroisopropyl hydroxyl groups becomes an economical burden, a top coat satisfying the above-mentioned performances at low cost has been required also in polymer production.

Incidentally, the hexafluoroisopropyl hydroxyl group is represented by the following structure and high in fluorine contents and contains a hydroxyl group serving as a polar group.

[Chemical Formula 1]

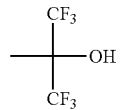

HEXAFLUOROISOPROPYL
HYDROXYL GROUP

In view of the above-mentioned problems caused when the top coat composition as discussed in Patent Publication 1 contains two hexafluoroisopropyl hydroxyl groups, the present inventors have eagerly made studies in order to solve them. At first, the inventors expected that the problems could be solved by reducing the number of hexafluoroisopropyl hydroxyl groups, and therefore made studies on a top coat composition composed of a polymer including a repeating unit in which one hexafluoroisopropyl hydroxyl group is bonded as a substituent to an aliphatic structure. Contrary to the expectation, the top coat composition was hardly dissolved in a developing solution (see Comparative Example 4).

The present inventors further made studies on improvements of the developing solution-solubility in combination with the other substituent. As a result of using a polymer to which a specified number of hydroxyl groups serving as the other substituent were introduced as the top coat composition, it was surprisingly found not only that solubility of the polymer in an organic solvent is improved but also that a top coat formed therefrom provided a moderate developing solution-solubility, a water resistance and a good separation between water and a resist film, the top coat composition not affecting a resist layer. With this, the inventors resulted in the present invention. A polymerizable compound where a hexafluoroisopropyl hydroxyl group and a hydroxyl group are concurrently bonded to an aliphatic structure has not hitherto been known, much less the fact that a polymer obtained therefrom can be used as the top coat.

The present invention is a top coat composition comprised of a fluorinated polymer including a repeating unit having: a polymerizable group; an aliphatic structure, i.e., a 5-membered ring or a 6-membered ring; and a ring to which one hexafluoroisopropyl hydroxyl group and 1 to 4 hydroxyl groups are bonded in the case of the 6-membered ring or a ring to which one hexafluoroisopropyl hydroxyl group and 1 to 3 hydroxyl groups are bonded in the case of the 5-membered ring. Incidentally, the hexafluoroisopropyl hydroxyl group and the hydroxyl groups bonded to the ring may be partially or entirely protected with a protecting group.

Additionally, the raw material for synthesizing a fluorinated polymer that constitutes the top coat composition of the present invention, i.e., a fluorinated monomer, is characterized by being excellent in polymerization reactivity and by being capable of producing the fluorinated polymer useful for the top coat composition at relatively low cost.

The present invention includes the following [Invention 1] to [Invention 10].

[Invention 1]

A top coat composition formed on a resist film to protect the resist film, the top coat composition being characterized by containing a fluorinated polymer having a repeating unit represented by the following general formula (5).

[Chemical Formula 2]

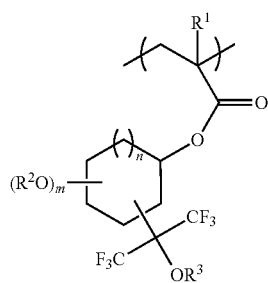

(5)

[In the formula, $R^1$ represents a hydrogen atom, methyl group, fluorine atom, or trifluoromethyl group. n represents 0 or 1. m is an integer of from 1 to (3+n). $R^2$ and $R^3$ each independently represents a hydrogen atom or a protecting group.]

[Invention 2]

A top coat composition as discussed in Invention 1, wherein both $R^2$ and $R^3$ of the repeating unit represented by the general formula (5) are hydrogen atoms.

[Invention 3]

A top coat composition as discussed in Invention 2, characterized by containing a fluorinated polymer including at least one of repeating units represented by the following general formula (6) to general formula (8).

[Chemical Formula 3]

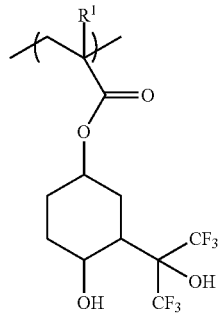

(6)

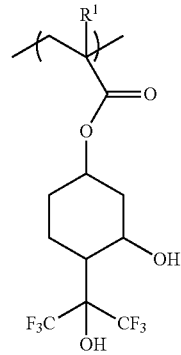

(7)

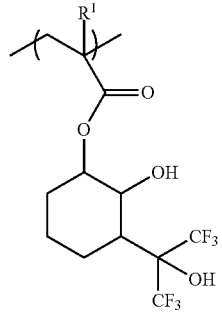

(8)

[In the formula, $R^1$ represents a hydrogen atom, methyl group, fluorine atom, or trifluoromethyl group.]

[Invention 4]

A top coat composition as discussed in any one of Invention 1 to Invention 3, characterized in that the fluorinated polymer includes a repeating unit having an acid labile group.

[Invention 5]

A top coat composition as discussed in any one of Invention 1 to Invention 4, characterized by containing an organic solvent.

[Invention 6]

A top coat composition as discussed in Invention 5, wherein the organic solvent is formed of one kind or two or more kinds of organic solvents selected from the group consisting of cyclic or chain hydrocarbons having 5 to 20 carbon atoms, alcohols having 1 to 20 carbon atoms and cyclic or chain hydrocarbons partially substituted with fluorine.

[Invention 7]

A top coat composition as discussed in Invention 5 or Invention 6, wherein the organic solvent is a solvent obtained by mixing 50% to lower than 99.9% of hydrocarbons having 5 to 20 carbon atoms and 0.1% to lower than 50% of alcohols having 1 to 20 carbon atoms.

[Invention 8]

A top coat composition as discussed in any one of Inventions 1 to 7, characterized by being used for immersion lithography.

[Invention 9]

A top coat for producing a semiconductor device, formed of a top coat composition as discussed in any one of Invention 1 to Invention 8.

[Invention 10]

A semiconductor device produced by using a top coat as discussed in Invention 9.

DETAILED DESCRIPTION

A top coat composition of the present invention has a moderate developing solution-solubility and a water resistance and forms a top coat film excellent in separability between water and a resist film. With the top coat composition, the effect of not affecting a resist layer is obtained.

Additionally, a polymerizable fluorinated monomer constituting the top coat composition of the present invention is characterized by being excellent in polymerization reactivity and being able to produce a fluorinated polymer useful for the top coat composition at relatively low cost.

The top coat composition of the present invention is a top coat composition (sometimes referred to as "a top coat solution" in this specification) used for forming a top coat (sometimes referred to as "a top coat film" in the specification) disposed on a resist film so as to protect the resist film, and is a top coat composition for photoresist, characterized by containing a fluorinated polymer including a repeating unit represented by the following general formula (5).

[Chemical Formula 4]

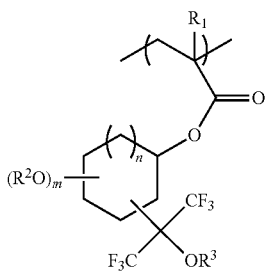

(5)

[In the formula, $R^1$ represents a hydrogen atom, methyl group, fluorine atom, or trifluoromethyl group. n represents 0 or 1. m is an integer of from 1 to (3+n). $R^2$ and $R^3$ each independently represents a hydrogen atom or a protecting group.]

The polymerizable fluorinated monomer which is to provide the fluorinated polymer including the repeating unit of the above general formula (5) can be represented by the following general formula (1).

[Chemical Formula 5]

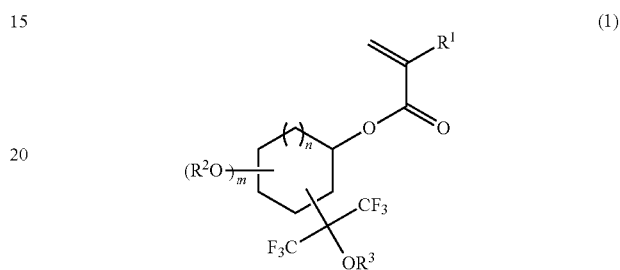

(1)

[In the formula, $R^1$ represents a hydrogen atom, methyl group, fluorine atom, or trifluoromethyl group. n is an integer of 0 or 1, and m is that of from 1 to (3+n). $R^2$ and $R^3$ each independently represents a hydrogen atom or a protective group.] The general formula (1) represents a 5-membered ring with n=0, while representing a 6-membered ring with n=1. The present invention may take either the 5-membered ring or the 6-membered ring, but preferably takes the 6-membered ring because of its availability, cost and easiness to synthesize.

Additionally, in, the number of a substituent ($R^2O$)—, is 1 to (3+n). It may be 1 to 3 in the case of the 5-membered ring, while it may be 1 to 4 in the case of the 6-membered ring.

A compound represented by the general formula (1) may include a structure in which two substituents other than hydrogen atom are concurrently bonded to each carbon atom constituting an alicyclic structure. However, in the case where the substituents are bonded to the carbon atom, a structure where one substituent and one hydrogen atom are bonded to the carbon atom is preferable because such a structure is readily available. Therefore, a fluorinated monomer having a structure where at least one hydrogen atom is bonded to every carbon atom constituting the alicyclic structure is preferably adopted as the compound represented by the general formula (1).

$R^2$ and $R^3$ each independently represents a hydrogen atom or a protecting group. As will be discussed below, the protecting group is useful in a case required to adjust compatibility with water or a developing solution, water-repellency, or solubility of polymer in a solvent; however, in normal circumstances, those in which both $R^2$ and $R^3$ are hydrogen atoms are preferably used.

The polymerizable fluorinated monomer represented by the general formula (1), in which both $R^2$ and $R^3$ are hydrogen carbons, are concretely exemplified as follows.

[Chemical Formula 6]
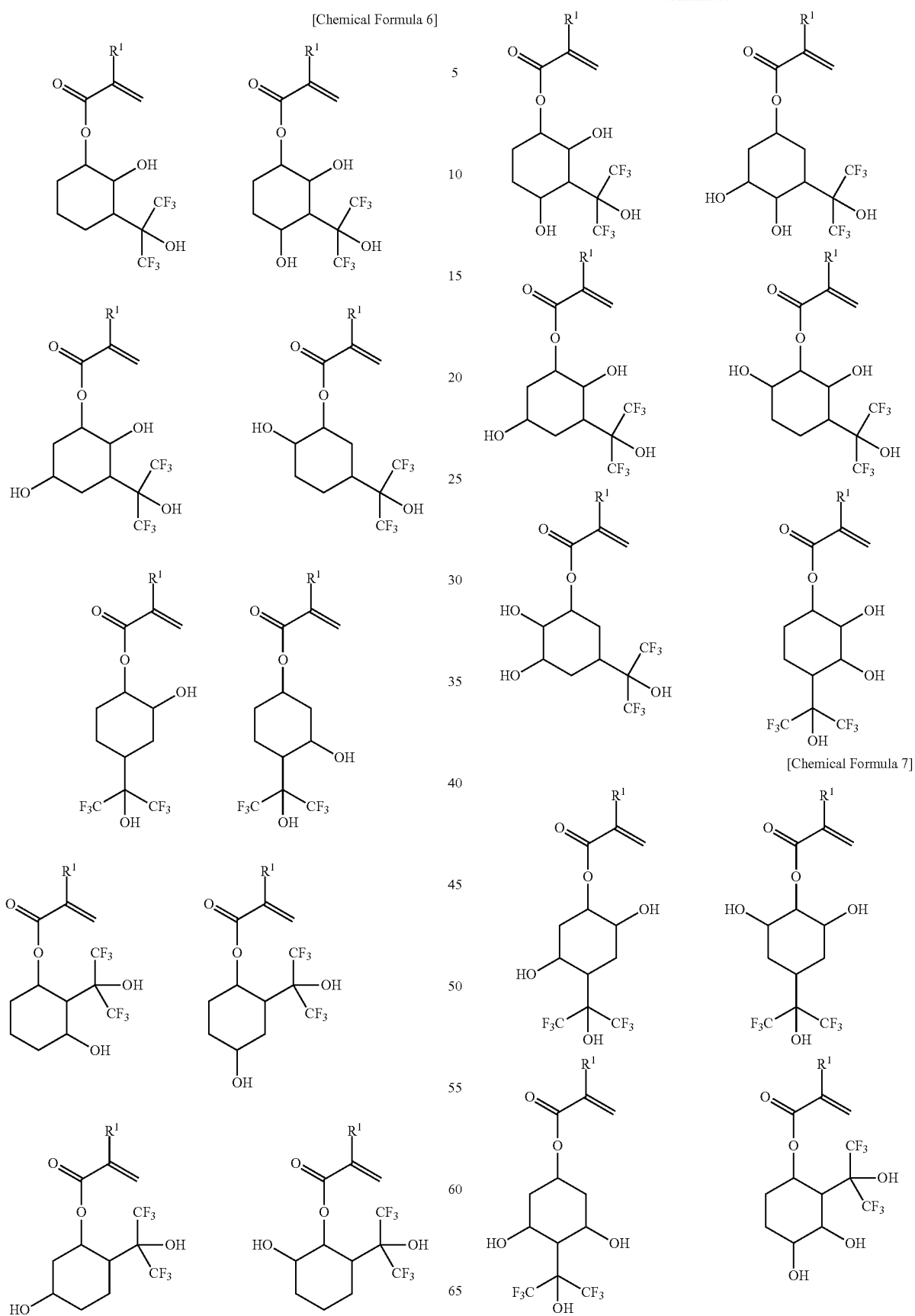
[Chemical Formula 7]

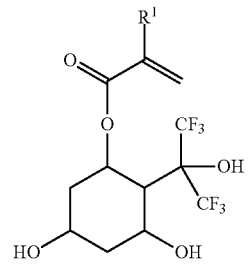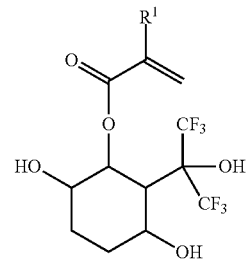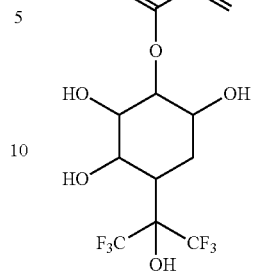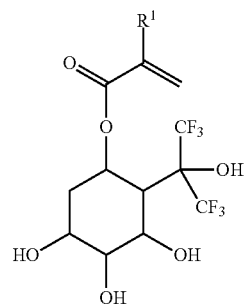
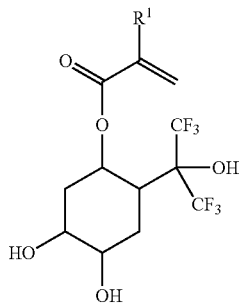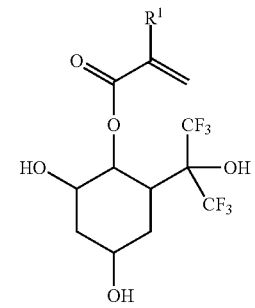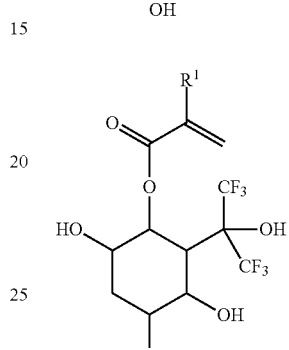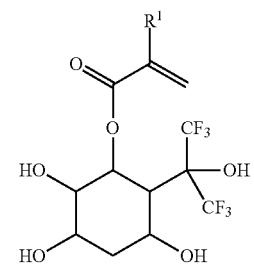
[Chemical Formula 8]
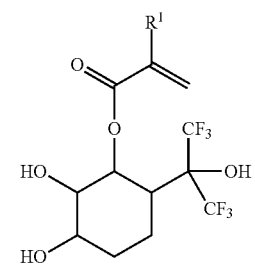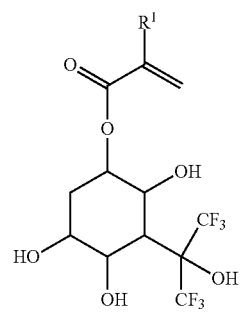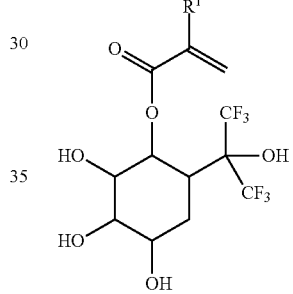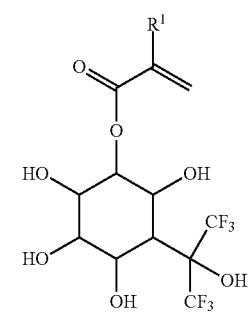
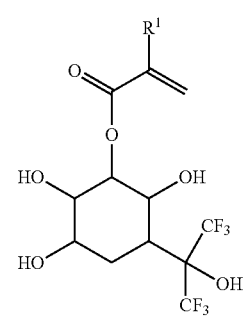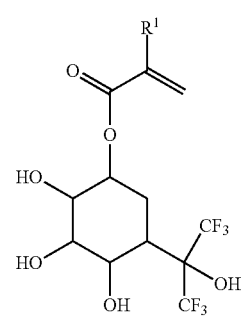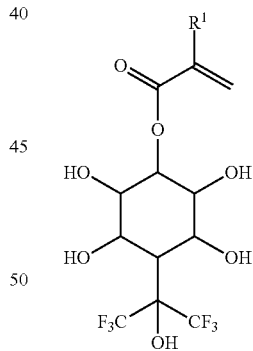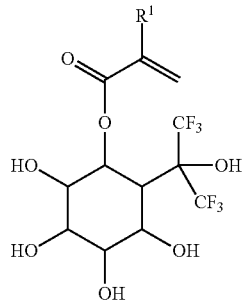
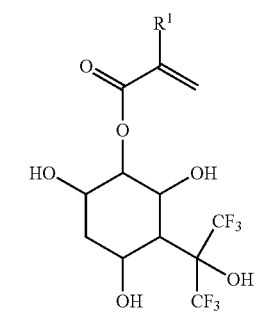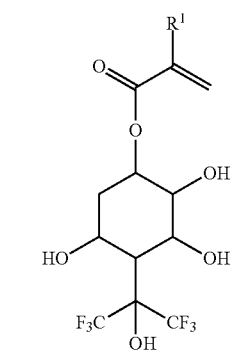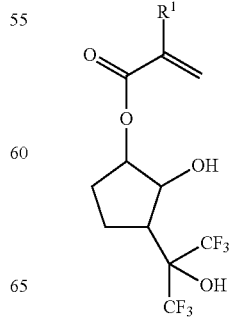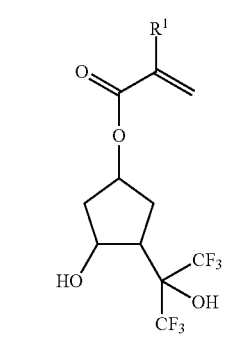

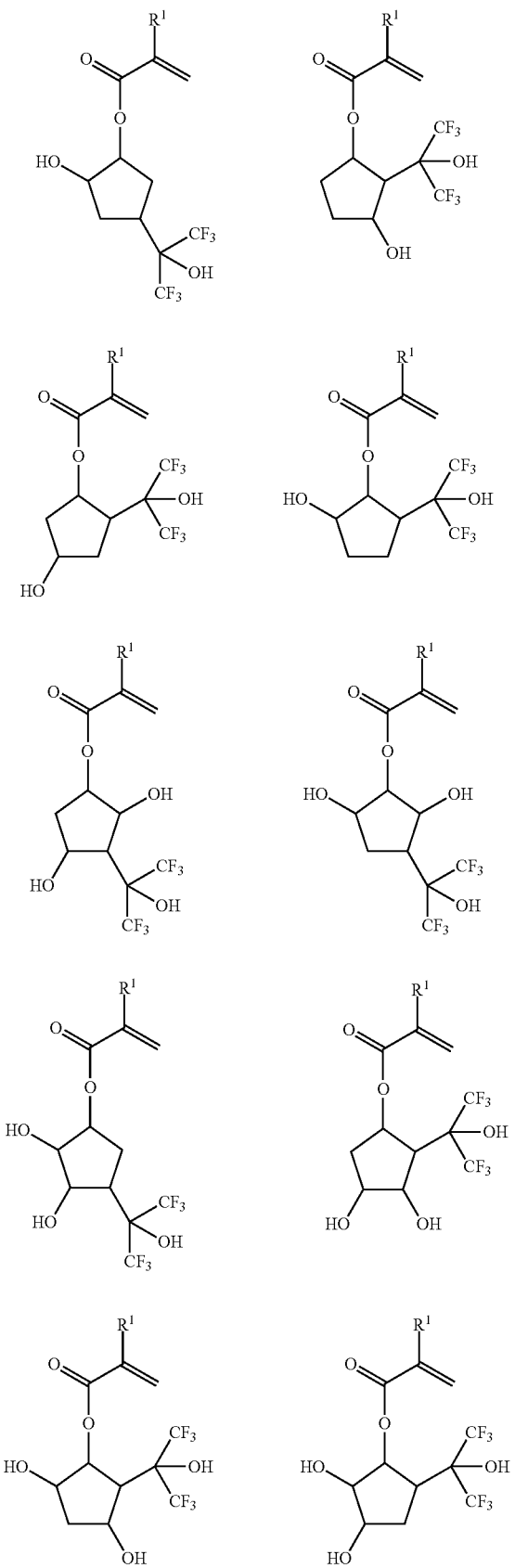
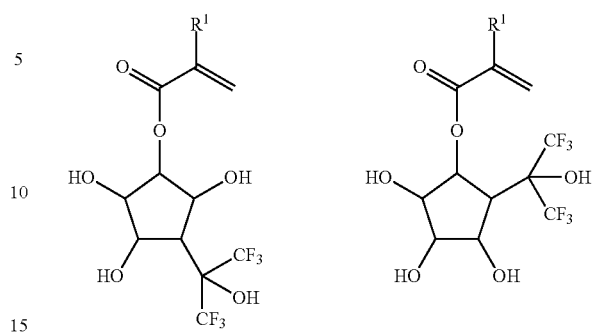

[In the formula, $R^1$-represents a hydrogen atom, methyl group, fluorine atom, or trifluoromethyl group.]

As shown above, the number of hydroxyl groups directly bonded to the ring may take a range of from 1 to 3 in the 5-membered ring while taking a range of from 1 to 4 in the 6-membered ring. The hydroxyl groups are effective at growing solubility in the developing solution, but increase the possibility of causing swelling at the time of development, with increasing the number thereof. Though it somewhat depends on a balance between solubility and swelling performance, the number of the hydroxyl groups of from 1 to 2 is preferred to that of not less than 3.

Additionally, the case where a hexafluoroisopropyl hydroxyl group is bonded to a carbon atom in the ring adjacent to a carbon bonding to an ester group reduces polymerizability, so that a structure in which the hexafluoroisopropyl hydroxyl group is bonded to another carbon atom in the ring is preferable.

Additionally, it is preferable that the hexafluoroisopropyl hydroxyl group is adjacent to a hydroxyl group, in relation to the availability, cost and easiness to synthesize of the raw material.

In view of the above, polymerizable fluorinated monomers represented by the following general formula (2), the general formula (3) and general formula (4) is preferably selected from the compounds as exemplified above.

[Chemical Formula 9]

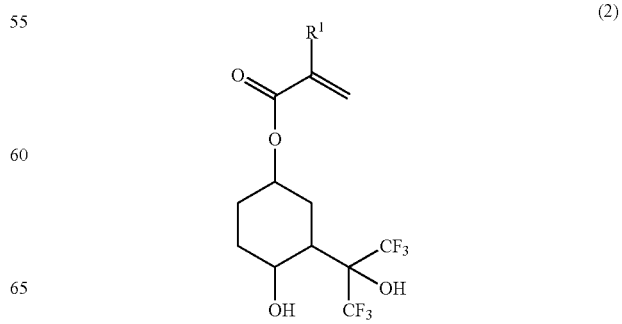

(2)

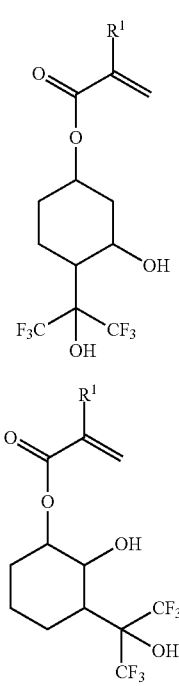

[In the formula, R¹ represents the same to that in the general formula (1)]

As the protecting group, it is possible to cite a hydrocarbon group, alkoxycarbonyl group, acetal group, acyl group and the like. The hydrocarbon group is a straight-chain, branched or cyclic hydrocarbon group or aromatic hydrocarbon group having 1 to 25 carbon atoms and exemplified by methyl group, ethyl group, propyl group, isopropyl group, cyclopropyl group, n-propyl group, iso-propyl group, sec-butyl group, tert-butyl group, n-pentyl group, cyclopentyl group, sec-pentyl group, neopentyl group, hexyl group, cyclohexyl group, ethylhexyl group, norbornel group, adamantyl group, vinyl group, allyl group, butenyl group, pentenyl group, ethynyl group, phenyl group, benzyl group, 4-methoxybenzyl group and the like. The above-mentioned functional groups may be partially or entirely substituted with fluorine atom.

As the alkoxycarbonyl group, it is possible to cite tert-butoxycarbonyl group, tert-amyloxycarbonyl group, methoxycarbonyl group, ethoxycarbonyl group, i-propoxycarbonyl group and the like. As the acetal group, it is possible to cite chain-like ether groups of methoxymethyl group, methoxyethoxymethyl group, ethoxyethyl group, butoxyethyl group, cyclohexyloxyethyl group, benzyloxyethyl group, phenethyloxyethyl group, ethoxypropyl group, benzyloxypropyl group, phenethyloxypropyl group, ethoxybutyl group and ethoxyisobutyl group, and cyclic ether groups such as tetrahydrofuranyl group, tetrahydropyranyl group and the like.

As the acyl group, it is possible to cite acetyl group, propionyl group, butyryl group, heptanoyl group, hexanoyl group, valeryl group, pivaloyl group, isovaleryl group, lauryloyl group, myristoyl group, palmytoyl group, stearoyl group, oxalyl group, malonyl group, succinyl group, glutaryl group, adipoyl group, piperoyl group, suberoyl group, azelaoyl group, sebacoyl group, acryloyl group, propioloyl group, methacryloyl group, crotonoyl group, oleoyl group, maleoyl group, fumaroyl group, mesaconoyl group, campholoyl group, benzoyl group, phthaloyl group, isophthaloyl group, terephthaloyl group, naphthoyl group, toluoyl group, hydratoropoyl group, atoropoyl group, cinnamoyl group, furoyl group, thenoyl group, nicotinoyl group, isonicotinoyl group and the like. Furthermore, it is also possible to use those in which hydrogen atoms of the above substituents are partially or entirely substituted with fluorine atom.

An aromatic compound into which a hexafluoroisopropyl hydroxyl group is introduced, which serves as an intermediate in production of polymerizable fluorinated monomers represented by the general formulas (1) to (4), is obtained by reacting a corresponding hydroxyl-substituted aromatic compound with hexafluoroacetone, according to the method discussed in the following Non-Patent Publication 3, for example.

"Non-Patent Publication 3" Basil S. Farah, Everett E. Gilbert, Morton Litt, Julian A. Otto, John P. Sibilia J. Org. Chem., 1965, 30(4), pp 1003-1005

Then, a reaction for adding hydrogen to a ring of the intermediate is conducted to lead the intermediate to a corresponding alicyclic compound (alcohol form). Furthermore, this is esterified with (meth)acrylic acid or a reactive derivative thereof, thereby allowing synthesizing the polymerizable fluorinated monomers.

As an example, a production route of the polymerizable monomer represented by the general formula (3) will be hereinafter shown. Resorcinol is prepared as the raw material and a hexafluoroisopropyl hydroxyl group is introduced thereinto. Then, it is led to a corresponding alcohol form with the addition of hydrogen to the ring, followed by esterification, thereby achieving the production.

[Chemical Formula 10]

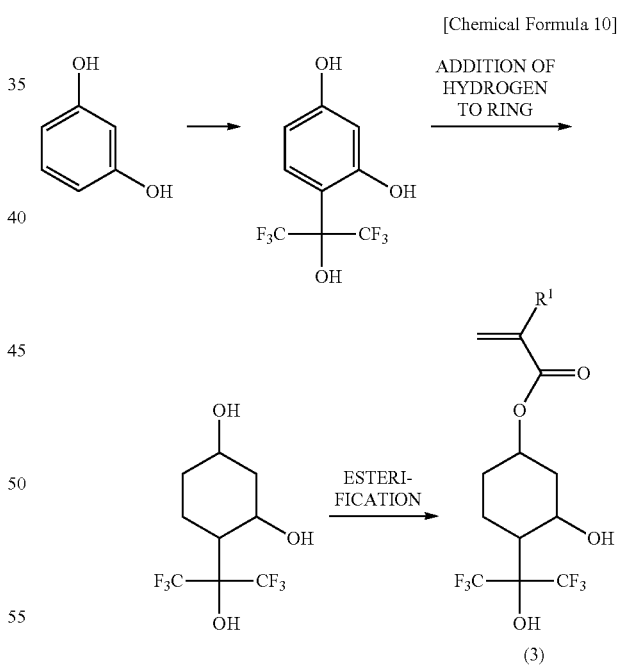

In the production of the polymerizable fluorinated monomers represented by the general formulas (1) to (4), a method of adding hydrogen to the ring is not particularly limited and therefore known methods may be used. A method of adding hydrogen by using a noble metal catalyst such as Ru/C together with an organic solvent is preferably adopted.

Additionally, a method for obtaining a polymerizable monomer such as methacrylic ester and the like from a corresponding alcohol is not particularly limited, and therefore known esterification methods may be used. As a methacrylic acid derivative, it is possible to concretely cite acrylic acid, methacrylic acid, trifluoromethylacrylic acid, acrylic acid chloride, methacrylic acid chloride, trifluoromethylacrylic acid chloride, acrylic anhydride, methacrylic anhydride, trifluoromethylacrylic anhydride and the like.

In esterification, a catalyst may be either used or not used; however, it is possible to use the catalyst for the purpose of obtaining an appropriate reaction temperature and reaction rate. As a representative example, it is possible to perform the reaction in the presence of an acid catalyst, in the case of using a carboxylic acid such as acrylic acid, methacrylic acid, trifluoromethylacrylic acid and the like as the raw material. Additionally, it is also possible to perform the reaction in the presence of an acid catalyst or a basic catalyst, in the case of using acid chloride such as acrylic acid chloride, methacrylic acid chloride, trifluoromethylacrylic acid chloride and the like or anhydride such as acrylic anhydride, methacrylic anhydride, trifluoromethylacrylic anhydride and the like. Among these, anhydride is preferably adopted because a moderate reaction rate is obtained in the case of using it.

The amount of the acrylic acid derivative to be used is satisfactorily not lower than 1 molar time relative to 1 mol of a fluorinated alcohol prepared as the raw material, and preferably 1.0 molar time to 5 molar times from the viewpoint of the reaction rate and the yield of the target polymerizable fluorinated monomer. Furthermore, the amount of 1.05 molar times to 2 molar times is more preferable.

Among the above-mentioned acid catalysts, usable ones include proton acids and Lewis acids. If these are exemplified, it is possible to cite proton acids such as hydrogen fluoride, sulfuric acid, phosphoric acid, hydrogen chloride, methansulfonic acid, trifluoromethanesulfonic acid, trifluoroacetic acid and the like, and Lewis acids such as aluminum chloride, aluminum bromide, gallium chloride, gallium bromide, ferric chloride ($FeCl_3$), zinc chloride, antimony chloride, titanium tetrachloride, tin tetrachloride, boron trifluoride, $Ti(OCH_3)_4$, $Ti(OC_2H_5)_4$, $Ti(OC_4H_9)_4$, $Ti(OCH(CH_3)_2)_4$, $Zn(CH_3COO)_2 \cdot 2H_2O$ and the like. Of these, proton acids are preferably adopted because the target product is obtained with high yields in the case of using them. More preferably, methanesulfonic acid which is easily available and promptly develops the reaction is adopted.

As the amount of the acid catalyst, an amount of from 0.01 to 10 molar times relative to 1 mol of the fluorinated alcohol prepared as the raw material may be adopted. The case of 0.01 molar time or less is impractical from the facts that the reaction rate is too slow and that the yield of the target polymerizable fluorinated monomer is extremely small. Additionally, even if adding acid of not less than 10 molar times, the effect of improving the yield is not expected, and furthermore, a by-product is increased. It is more preferable to use acid of 0.1 to 1.5 molar times relative to 1 mol of a substrate to achieve a moderate reaction rate and a good yield.

In the case of using acrylic anhydride or acrylic acid chloride as the raw material for the acrylic acid derivative, it is good to use base in order to trap acid (carboxylic acid or hydrogen chloride) to be generated by the reaction. As base, it is possible to use organic bases such as pyridine, lutidine, triethylamine, diethylamine, piperidine, pyrrolidine, 1,8-diazabicyclo[5.4.0]-7-undecene and the like, in addition to inorganic bases such as sodium hydroxide, sodium carbonate, sodium hydrogencarbonate, potassium hydroxide, potassium carbonate, potassium hydrogencarbonate, sodium hydride, sodium methoxide, sodium ethoxide, sodium tert-butoxide, potassium tert-butoxide and the like. The organic bases are preferably used, in which lutidine is particularly used.

The amount of the base to be used is 1 to 10 molar times and preferably 1 to 3 molar times relative to 1 mol of the fluorinated alcohol.

A solvent used in the esterification reaction is not particularly limited so long as it is stable during the reaction and capable of dissolving the fluorinated alcohol serving as the raw material. For example, it is possible to cite hydrocarbons such as hexane, heptane, benzene, toluene, xylene and the like, ethers such as diethyl ether, tetrahydrofuran, dioxane and the like, halogenated hydrocarbons such as dichloromethane, chloroform and the like, and aprotic polar solvents such as acetonitrile, N,N-dimethylformamide, dimethyl sulfoxide, hexamethylphosphoric triamide and the like. These may be used singly or in combination of not less than two kinds thereof.

The reaction temperature in esterification is not particularly limited, and it is possible to conduct the reaction within a range of from room temperature to 200° C. under normal circumstances. The reaction rate is to change with the kind and amount of the acrylic acid derivative, the acid catalyst and the base and the like, so that the reaction time is suitably changed according to these. In actuality, it is possible to continue the reaction until the raw material is consumed, by conducting the reaction while successively analyzing a reaction solution during the reaction. A treatment made after the reaction is not particularly limited, in which a method of extracting the target product by extraction operation with an organic solvent upon adding the reaction solution to water or ice water or a method of extracting the target product by distillation is practicable.

Then, the fluorinated polymer relating to the top coat composition of the present invention will be explained. The fluorinated polymer of the present invention is a polymer characterized by containing a repeating unit represented by the general formula (5), and is produced in such a manner that the polymerizable fluorinated monomer represented by the general formula (1) causes cleavages at its double bond by itself or causes copolymerization with another monomer.

[Chemical Formula 11]

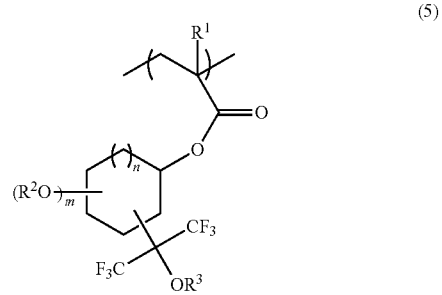

(5)

[In the formula, $R^1$, n, m and $R^2$ or $R^3$ represent the same to those in the general formula (1).]

The repeating unit represented by the general formula (5) is formed by cleavage of a polymerizable double bond of the fluorinated monomer represented by the general formula (1), and the other structures are maintained. Hence explanations about $R^1$, $R^2$, $R^3$, m and n and concrete examples of combination of these can apply the disclosure about the fluorinated monomer represented by the general formula (1) entirely.

Among repeating units obtained by using the above-mentioned polymerizable fluorinated monomers, a fluorinated polymer containing at least one of fluorinated polymers having repeating units represented by the general formulas (6), (7) and (8) is preferably used.

[Chemical Formula 12]

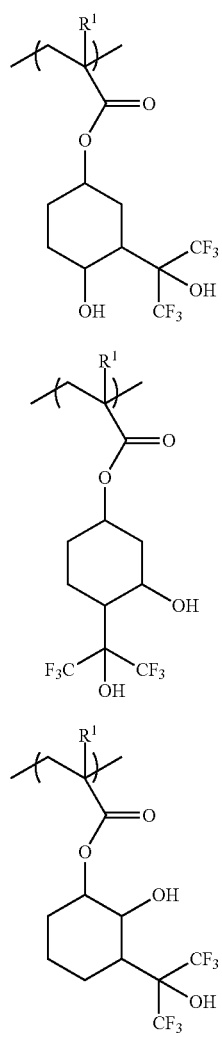

[In the formula, $R^1$ represents the same to that in the general formula (1).] Incidentally, in the general formulas (6) to (8), a hexafluoroisopropyl hydroxyl group and hydroxyl groups bonded to the ring may be partially or entirely protected with a protecting group.

If monomers copolymerizable with the polymerizable fluorinated monomer of the present invention are concretely exemplified, it is possible to cite at least one or more kinds of monomers selected from maleic anhydride, acrylic esters, fluorine-containing acrylic esters, methacrylic esters, fluorine-containing methacrylic esters, styrene-based compounds, fluorine-containing styrene-based compounds, vinyl ethers, fluorine-containing vinyl ethers, allyl ethers, fluorine-containing allyl ethers, olefins, fluorine-containing olefins, norbornene compounds, fluorine-containing norbornene compounds, sulfur dioxide, vinyl silanes, vinylsulfonic acid and vinylsulfonic ester.

The copolymerizable acrylic ester or methacrylic ester can be used without a particular limitation in terms of ester side chain. If it is exemplified by known compounds, it is possible to cite alkyl esters of acrylic acid or methacrylic acid such as methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, n-hexyl acrylate, n-hexyl methacrylate, n-octyl acrylate, n-octyl methacrylate, 2-ethylhexyl acrylate, 2-ethylhexyl methacrylate, lauryl acrylate, lauryl methacrylate, 2-hydroxyethyl acrylate, 2-hydroxyethyl methacrylate, 2-hydroxypropyl acrylate, 2-hydroxypropyl methacrylate and the like, acrylates or methacrylates containing ethylene glycol, propylene glycol or tetramethylene glycol group, unsaturated amides such as acrylamide, methacrylamide, N-methylol acrylamide, N-methylol methacrylamide, diacetone acrylamide and the like, vinyl silanes and acrylic or methacrylic esters containing acrylonitrile, methacrylonitrile or alkoxysilane, tert-butyl acrylate, tert-butyl methacrylate, 3-oxocyclohexyl acrylate, 3-oxocyclohexyl methacrylate, adamantyl acrylate, adamantyl methacrylate, methyladamantyl acrylate, methyladamantyl methacrylate, ethyladamantyl acrylate, ethyladamantyl methacrylate, hydroxyadamantyl acrylate, hydroxyadamantyl methacrylate, cyclohexyl acrylate, cyclohexyl methacrylate, tricyclodecanyl acrylate, tricyclodecanyl methacrylate, an acrylate or methacrylate containing a ring structure such as lactone ring, norbornene ring and the like, acrylic acid, methacrylic acid, and the like. Furthermore, it is possible to perform copolymerization by using the above-mentioned acrylic or methacrylic ester having a cyano group at its α-position, or a similar compound such as maleic acid, fumaric acid, maleic anhydride and the like.

Additionally, as the above-mentioned fluorinated acrylic esters or fluorinated methacrylic esters, it is also preferable to use: a monomer containing at α-position of acryl a fluorine atom or a group having fluorine atom; or a fluorinated compound which serves as acrylic ester or methacrylic ester comprised of a substituent having fluorine atom at its ester moiety and contains fluorine at both the α-position and the ester moiety. Furthermore, a cyano group may be introduced into α-position. For example, as a monomer including α-position into which a fluorinated alkyl group is introduced, there is adopted a monomer in which a trifluoromethyl group, trifluoroethyl group, nonafluoro-n-butyl group or the like is provided to α-position of the above-mentioned non-fluorine-based acrylic or methacrylic esters.

On the other hand, monomers containing fluorine at its ester moiety are acrylic or methacrylic esters including a unit in which the ester moiety is a fluorine alkyl group that is a perfluoroalkyl group or fluoroalkyl group and in which a cyclic structure and a fluorine atom are coexistent at the ester moiety (the unit having: a fluorinated benzene ring, fluorinated cyclopentane ring, fluorinated cyclohexane ring, fluorinated cycloheptane ring or the like whose cyclic structure is substituted, for example, with a fluorine atom, trifluoromethyl group, hexafluoroisopropyl hydroxyl group or the like) and the like. Additionally, acrylic or methacrylic esters of which ester moiety is a fluorinated t-butyl ester group, and the like are also usable. It is also possible to use a monomer obtained by combining these fluorinated functional groups and the fluorinated alkyl group of α-position. If particularly representative ones of such units are exemplified in the form of monomer, it is possible to cite 2,2,2-trifluoroethyl acrylate, 2,2,3,3-tetrafluoropropyl acrylate, 1,1,1,3,3,3-hexafluoroisopropyl acrylate, heptafluoroisopropyl acrylate, 1,1-dihydroheptafluoro-n-butyl acrylate, 1,1,5-trihydrooctafluoro-n-pentyl acrylate, 1,1,2,2-tetrahydrotridecafluoro-n-octyl acrylate, 1,1,2,2-tetrahydroheptadecafluoro-n-decyl acrylate, 2,2,2-trifluoroethyl methacrylate, 2,2,3,3-tetrafluoropropyl methacrylate, 1,1,1,3,3,3-hexafluoroisopropyl methacrylate, heptafluoroisopropyl methacrylate, 1,1-dihydroheptafluoro-n-butyl methacrylate, 1,1,5-trihydrooctafluoro-n-pentyl methacrylate, 1,1,2,2-tetrahydrotridecafluoro-n-octyl methacrylate, 1,1,2,2-tetrahydroheptadecafluoro-n decyl methacrylate, perfluorocyclohexylmethyl acrylate, perfluorocyclohexylmethyl methacrylate, 6-[3,3,3-trifluoro-2-hydroxy-2-(trifluoromethyl)propyl]bicyclo [2,2,1]hept-2-yl acrylate, 6-[3,3,3-trifluoro-2-hydroxy-2-(trifluoromethyl)propyl]bicyclo [2,2,1]hept-2-yl 2-(trifluoromethyl)acrylate, 6-[3,3,3-trifluoro-2-hydroxy-2-(trifluoromethyl)propyl]bicyclo [2,2,1]hept-2-yl methacrylate, 1,4-bis(1,1,1,3,3,3-hexafluoro-2-hydroxyisopropyl)cyclohexyl acrylate, 1,4-bis(1,1,1,3,3,3-hexafluoro-2-hydroxyisopropyl)cyclohexyl methacrylate, 1,4-bis(1,1,1,3,3,3-hexafluoro-2-hydroxyisopropyl)cyclohexyl 2-trifluoromethyl acrylate, and the like.

Additionally, if polymerizable monomers usable for copolymerization and having a hexafluoroisopropyl hydroxyl group are exemplified, it is possible to cite compounds as discussed below.

[Chemical Formula 13]

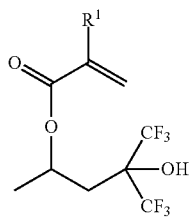
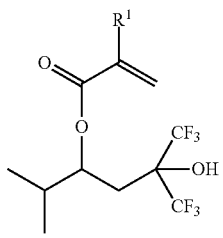
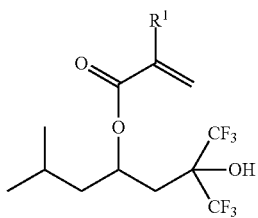
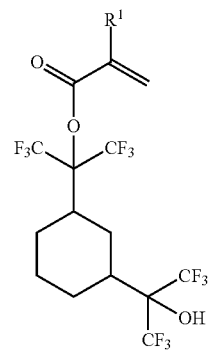
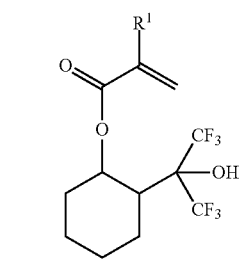
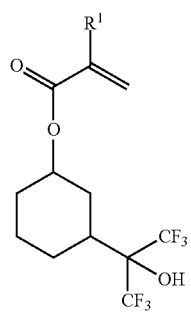
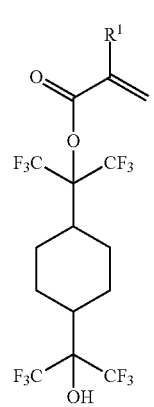
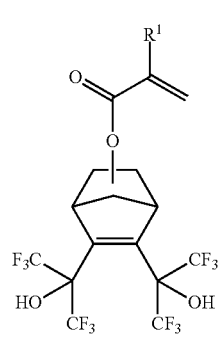
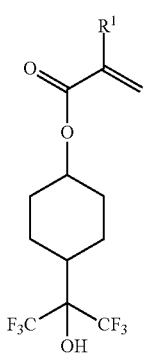
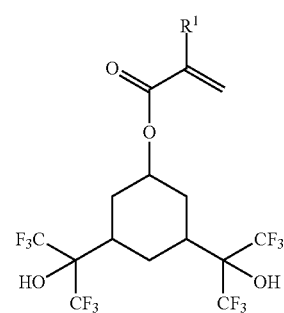
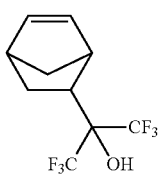
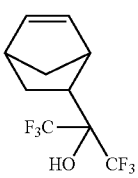
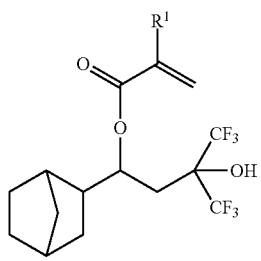
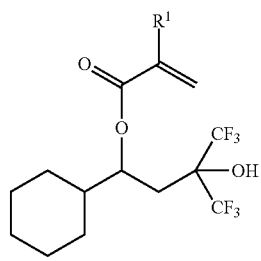
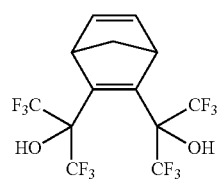
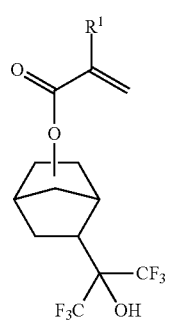

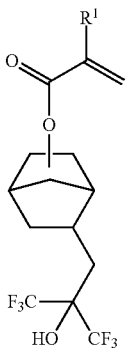 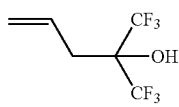

In this case, R¹ represents a hydrogen atom, methyl group, fluorine atom, or trifluoromethyl group. Additionally, a hexafluoroisopropyl hydroxyl group may be partially or entirely protected with the above-mentioned protecting group.

Furthermore, as styrene-based compounds and fluorinated styrene-based compounds, usable in the present invention, it is possible to use styrene, fluorinated styrene, hydroxystyrene and the like. More specifically, it is possible to use a styrene obtained by substituting hydrogen of an aromatic ring with a fluorine atom or trifluoromethyl group, such as pentafluorostyrene, trifluoromethylstyrene, bistrifluoromethylstyrene and the like, or a styrene obtained by substituting hydrogen of the aromatic ring with a hexafluoroisopropyl hydroxyl group or a functional group obtained by protecting a hydroxyl group thereof. Additionally, it is also possible to use the above-mentioned styrenes having α-position to which halogen, alkyl group or fluorinated alkyl group is bonded, or styrenes having a perfluorovinyl group.

Additionally, as vinyl ethers, fluorinated vinyl ethers, allyl ethers or fluorinated allyl ethers, usable for copolymerization, it is possible to use alkyl vinyl ethers or alkyl allyl ethers which may have a methyl group, ethyl group, propyl group, butyl group, a hydroxyl group such as hydroxyethyl group, hydroxybutyl group and the like. Additionally, it is also possible to use: cyclic-type vinyls having a cyclohexyl group, norbornyl group or aromatic ring or having hydrogen or a carbonyl bond in its cyclic structure; allyl ethers; or fluorinated vinyl ethers and fluorinated allyl ethers in which a part or all of hydrogens of the above-mentioned functional groups are substituted with fluorine atoms.

Incidentally, it is possible in the present invention to use vinyl esters, vinyl silanes, olefins, fluorinated olefins, norbornene compounds, fluorinated norbornene compounds and other compounds having a polymerizable unsaturated bond, without a particular limitation.

The above-mentioned olefins usable for copolymerization may be exemplified by ethylene, propylene, isobutene, cyclopentene, cyclohexene and the like. The fluorinated olefins may be exemplified by vinyl fluoride, vinylidene fluoride, trifluoroethylene, chlorotrifluoroethylene, tetrafluoroethylene, hexafluoropropylene, hexafluoroisobutene and the like.

The above-mentioned norbornene compounds and fluorinated norbornene compounds, usable in copolymerization, are norbornene monomers having a single or plurality of nucleus structures. In this case, these are norbornene compounds produced by Diels Alder addition reaction between cyclopentadiene or cyclohexadiene and unsaturated compounds such as fluorinated olefin, allyl alcohol, fluorinated allyl alcohol, homoallyl alcohol, fluorinated homoallyl alcohol, acrylic acid, α-fluoroacrylic acid, α-trifluoromethylacrylic acid, methacrylic acid, all of the acrylic acid ethers, methacrylic acid ethers, fluorinated acrylic acid ethers and fluorinated methacrylic acid ethers discussed in the present specification, 2-(benzoyloxy)pentafluoropropane, 2-(methoxyethoxymethyloxy)pentafluoropropene, 2-(tetrahydroxypyranyloxy)pentafluoropropane, 2-(benzoyloxy)trifluoroethylene, 2-(methoxymethyloxy)trifluoroethylene, and the like. It is possible to exemplify the norbornene compounds by 3-(5-bicyclo [2,2,1]hepten-2-yl)-1,1,1-trifluoro-2-(trifluoromethyl)-2-propanol or the like.

In the case of introducing an acid labile group into the fluorinated polymer of the present invention, a polymerizable monomer having the acid labile group may be used. As the monomer having the acid labile group, it is possible to use one in which the hexafluoroisopropyl hydroxyl group or the hydroxyl group bonded to the ring of the above-mentioned polymerizable fluorinated polymers represented by the general formulas (1) to (4) is protected with a protecting group, i.e., an acid labile protecting group; however, in general, a method of initiating copolymerization with other polymerizable monomers having the acid labile group is preferably employed.

Furthermore, as another method for obtaining a polymer or top coat composition having the acid labile group, it is possible to adopt a method of introducing the acid labile group into a previously obtained polymer by a subsequent polymer reaction or a method of mixing the monomer or polymer having an acid labile moiety.

The purpose of using the acid labile group is to improve the solubility of the top coat in an alkali developing solution in the vicinity of an exposed portion, while trapping acid generated in the resist film by exposing the resist film to a high-energy ray having 300 nm or less wavelengths, such as ultraviolet rays, an excimer laser, X-ray and the like, or electron beam and then dispersed into the top coat.

A polymerizable monomer having an acid labile group and usable in the present invention, other than polymerizable fluorinated monomers represented by the general formulas (1) to (4), can be used without a particular limitation so long as the acid labile group causes hydrolysis by acid generated from a photoacid generator so as to be eliminated therefrom. A polymerizable group is required only to be alkenyl group or cycloalkenyl group, and preferably vinyl group, 1-methylvinyl group or 1-trifluoromethylvinyl group. If it is exemplified, monomers having groups represented by the following general formulas (9) to (11) are preferably used.

[Chemical Formula 14]

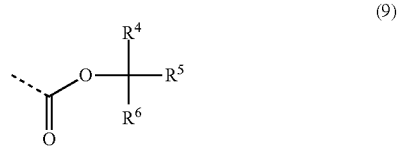

(9)

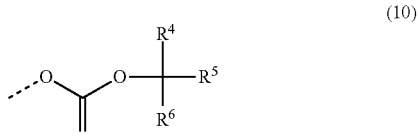

(10)

(11)

Here, R⁴, R⁵, R⁶, R⁷ and R⁸ are a straight-chain, branched or cyclic alkyl group having 1 to 25 carbon atoms, which may be the same. The alkyl group may partially contain a fluorine atom, oxygen atom, nitrogen atom, sulfur atom or hydroxyl group. Two of $R^4$, $R^5$ and $R^6$ may be bonded to form a ring.

Concrete examples of the groups represented by the general formulas (9) to (11) are not particularly limited and it can be exemplified by the following ones.

[Chemical Formula 15]

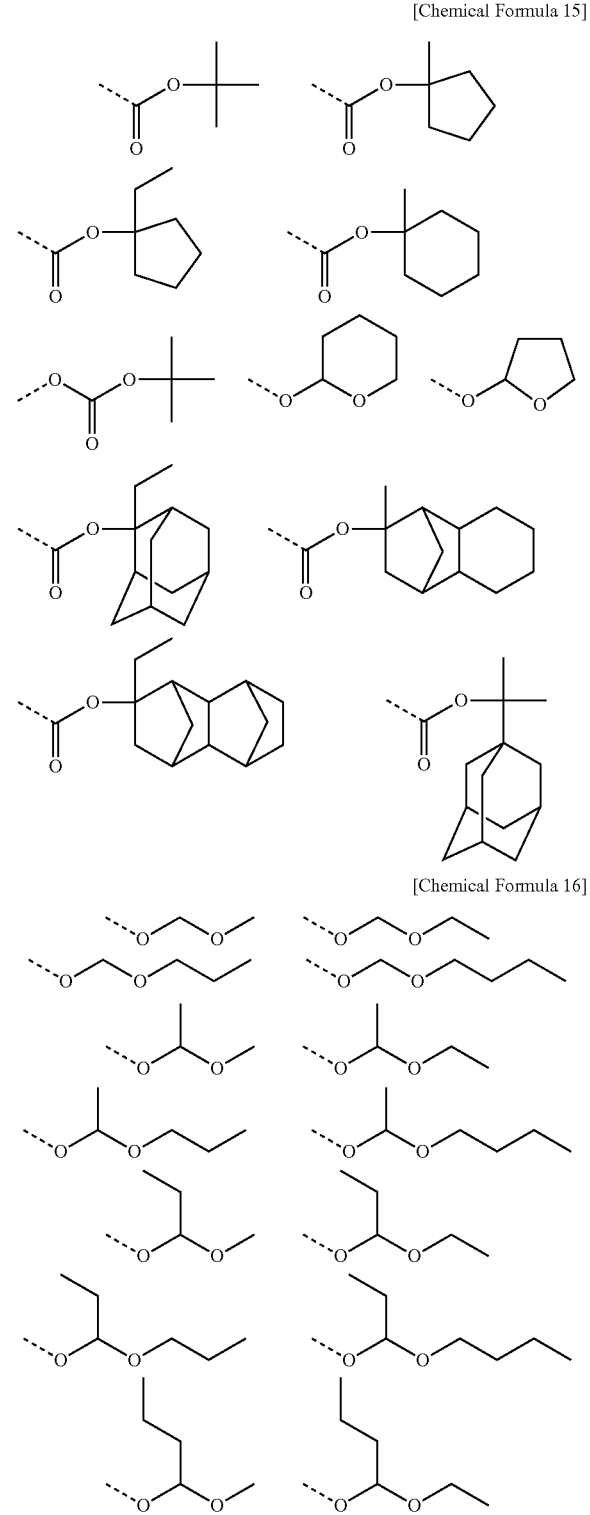

[Chemical Formula 16]

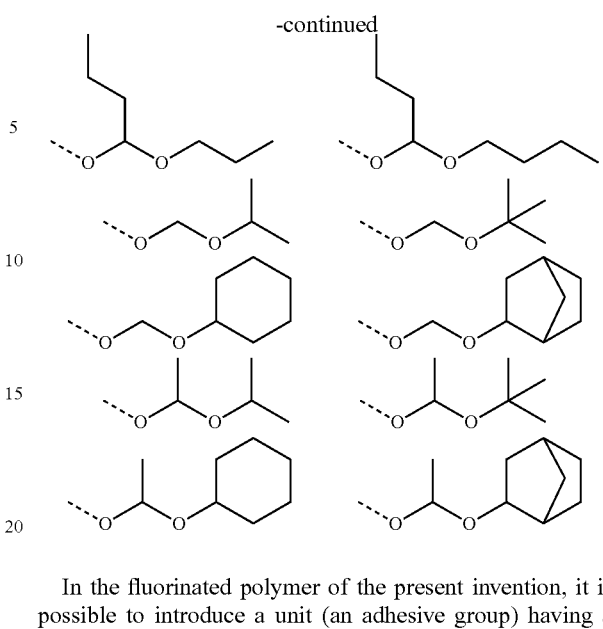

In the fluorinated polymer of the present invention, it is possible to introduce a unit (an adhesive group) having a lactone structure, for the purpose of improving adhesiveness to the substrate. In introduction of such a unit, a polymerizable monomer having a lactone structure is preferably used. The lactone structure can be exemplified by: monocyclic lactone structures such as groups obtained by eliminating one hydrogen atom from γ-butyrolactone or mevalonic lactone; polycyclic lactone structures such as groups obtained by eliminating one hydrogen atom from norbornane lactone; and the like. By copolymerizing acrylic ester or methacrylic ester having such a lactone structure so as to incorporate the lactone structure into the resist, it becomes possible not only to improve adhesiveness to the substrate but also to enhance compatibility with the developing solution.

Incidentally, the above-mentioned copolymerizable monomers usable in the present invention may be used singly or in combination of not less than two kinds thereof.

The fluorinated polymer according to the present invention may be comprised of repeating units of two or more monomers. The ratio can be determined without a particularly limitation, but ranges as discussed below are preferably adopted.

The fluorinated polymers according to the present invention are preferably comprised of a repeating unit formed by cleavage of the polymerizable fluorinated monomers represented by the general formulas (1) to (4). Additionally, the polymers may contain the repeating unit in an amount of from 1 to 100 mol %, more preferably from 5 to 90 mol %. In the case of copolymer, the fluorinated polymers according to the present invention may contain a repeating unit having an acid labile group, in an amount of from 1 to 80 mol %, preferably from 5 to 70 mol %, and more preferably from 10 to 60 mol %. Furthermore, the fluorinated polymers may contain a repeating unit not having the acid labile group by using other polymerizable monomers, in an amount of from 1 to 80 mol %, more preferably from 5 to 50 mol % of all repeating units.

In the case where the repeating unit formed by cleavage of the polymerizable fluorinated monomers represented by the general formulas (1) to (4) is smaller than 1 mol %, the effect resulted from the use of the monomers of the present invention is not apparently expected. Additionally, the case where the repeating unit having the acid labile group is smaller than 1 mol % does not provide the effect of introducing the acid labile group, which is therefore not preferable. In this case, it is preferable to use a monomer other than the monomers the monomers represented by the general formulas (1) for formation of the repeating unit having the acid labile group, and it is also preferable to use those obtained by leading the monomers represented by the general formulas (1) to (4) to monomers having the acid labile groups. Alternatively, those into which the acid labile groups are introduced by polymer reaction after polymerization may also be acceptable. The repeating units derived from the other polymerizable monomers not having the acid labile groups are used in order to improve solubility of the fluorinated polymer in organic solvents, and etching resistance and mechanical strength of film; however, 1 mol % or less does not exhibit such effects, while 80 mol % or more decreases the content of the repeating units formed by cleavage of polymerizable fluorinated monomers represented by the general formulas (1) to (4) so as not to sufficiently exhibit such effects, which is therefore not preferable.

A method of polymerizing the fluorinated polymer relating to the top coat composition of the present invention is not particularly limited as far as it is a generally usable method. However, radical polymerization, ionic polymerization or the like is preferable, and it is also possible to use coordination anion polymerization, living anion polymerization, cation polymerization, ring-opening metathesis polymerization, vinylene polymerization or the like in some cases.

The radical polymerization may be conducted by a known polymerization method such as bulk polymerization, solution polymerization, suspension polymerization and emulsion polymerization, in the presence of a radical polymerization initiator or radical initiating source, with a batch-wise, semi-continuous or continuous operation.

The radical polymerization initiator is not particularly limited. As its examples, azo compounds, peroxide compounds and redox compounds are cited. The particularly preferable examples are azobisisobutyronitrile, t-butylperoxypivalate, di-t-butylperoxide, i-butyrylperoxide, lauroylperoxide, succinic acid peroxide, dicinnamylperoxide, di-n-propylperoxydicarbonate, t-butylperoxyallyl monocarbonate, benzoyl peroxide, hydrogen peroxide, ammonium persulfate and the like.

A reaction vessel used in the polymerization reaction is not particularly limited. Additionally, a polymerization solvent may be used in the polymerization reaction. As the polymerization solvent, one that does not interfere with the radical polymerization is preferable, and representative ones are ester-based ones such as ethyl acetate, n-butyl acetate and the like; ketone-based ones such as acetone, methyl isobutyl ketone and the like; hydrocarbon-based ones such as toluene, cyclohexane and the like; and alcohol-based solvents such as methanol, isopropyl alcohol, ethylene glycol monomethyl ether and the like. Additionally, it is also possible to use various types of solvents, such as water, ether-based ones, cyclic ether-based ones, fluorohydrocarbon-based ones, aromatic ones and the like. These solvents can be used singly or in combination of not less than two kinds of them. Additionally, a molecular weight adjusting agent such as mercaptan may be used together therewith. The reaction temperature in the polymerization reaction is suitably changed according to the radical polymerization initiator or radical polymerization initiating source, and is preferably 20 to 200° C. in general, particularly preferably 30 to 140° C.

On the other hand, the ring-opening metathesis polymerization is required only to use a transition metal catalyst of the groups 4 to 7 in the presence of a cocatalyst. It can be conducted by a known method in the presence of a solvent.

The polymerization catalyst therefor is not particularly limited. As examples, it is possible to cite Ti-based, V-based, Mo-based and W-based catalysts. In particular, titanium(IV) chloride, vanadium(IV) chloride, vanadium trisacetylacetonate, vanadium bisacetylacetonatedichloride, molybdenum (VI) chloride, and tungsten(VI) chloride and the like are preferable. The amount of the catalyst is 10 mol % to 0.001 mol %, preferably 1 mol % to 0.01 mol % relative to the used monomer.

As the cocatalyst, alkylaluminum, alkyltin and the like are cited. In particular, it can be exemplified by aluminum-based ones including: trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum and the like; dialkylaluminum halides such as dimethylaluminum chloride, diethylaluminum chloride, diisopropylaluminum chloride, diisobutylaluminumchloride and the like; monoalkylaluminum halides such as methylaluminum dichloride, ethylaluminum dichloride, ethylaluminum diiodide, propylaluminum dichloride, isopropylaluminum dichloride, butylaluminum dichloride, isobutylaluminum dichloride and the like; and alkylaluminum sesquichlorides such as methylaluminum sesquichloride, ethylaluminum sesquichloride, propylaluminum sesquichloride, isobutylaluminum sesquichloride and the like; and by tetra-n-butyltin, tetraphenyltin, triphenylchlorotin and the like. The amount of the cocatalyst is 100 equivalents or less, preferably 30 equivalents or less by molar ratio relative to the transition metal catalyst.

The polymerization solvent will do unless it interferes with the polymerization reaction, and representative examples thereof are; aromatic hydrocarbon-based ones such as benzene, toluene, xylene, chlorobenzene, dichlorobenzene and the like; hydrocarbon-based ones such as hexane, heptane, cyclohexane and the like; and halogenated hydrocarbons such as carbon tetrachloride, chloroform, methylene chloride, 1,2-dichloroethane and the like. Additionally, these solvents may be used singly or in combination of two or more kinds. The reaction temperature is preferably −70 to 200° C. in general, particularly preferably −30 to 60° C.

The vinylene polymerization is required only to use a transition metal catalyst of the groups 8 to 10 such as iron, nickel, rhodium, palladium, platinum and the like, or a metal catalyst of the groups 4 to 6 such as zirconium, titanium, vanadium, chromium, molybdenum, tungsten and the like in the presence of cocatalyst. It can be conducted by a known method in a solvent.

The polymerization catalyst is not particularly limited. As particularly preferable examples, there are cited: transition metal compounds of the groups 8 to 10, such as iron(II) chloride, iron(III) chloride, iron(II) bromide, iron(III) bromide, iron(II) acetate, iron(III) acetylacetonate, ferrocene, nickelocene, nickel(II) acetate, nickel bromide, nickel chloride, dichlorohexylnickel acetate, nickel lactate, nickel oxide, nickel tetrafluoroborate, bis(allyl)nickel, bis(cyclopentadienyl)nickel, nickel(II) hexafluoroacetylacetonatetetrahydrate, nickel(II) trifluoroacetylacetonatedihydrate, nickel(II) acetylacetonatetetrahydrate, rhodium(III) chloride, rhodium tris(triphenylphosphine)trichloride, palladium(II) bis(trifluoroacetate), palladium(II) bis(acetylacetonate), palladium(II) 2-ethylhexanoate, palladium(II) bromide, palladium(II) chloride, palladium(II) iodide, palladium(II) oxide, monoacetonitriletris(triphenylphosphine)palladium(II) tretrafluoroborate, tetrakis(acetonitrile)palladium(II) tetrafluoroborate, dichlorobis(acetonitrile)palladium(II), dichlorobis (triphenylphosphine)palladium(II), dichlorobis (benzonitrile)palladium(II), palladium acetylacetonate, palladium bis(acetonitrile)dichloride, palladium bis(dimethylsulfoxide)dichloride, platinum bis(triethylphosphine)hydrobromide and the like; and transition metal compounds of the groups 4 to 6, such as vanadium(IV) chloride, vanadium trisacetylacetonate, vanadium bisacetylacetonatedichloride, trimethoxy(pentamethylcyclopentadienyl)titanium(IV), bis(cyclopentadienyl)titanium dichloride, bis(cyclopentadienyl)zirconium dichloride and the like. The catalyst amount is from 10 mol % to 0.001 mol %, preferably from 1 mol % to 0.01 mol % relative to the used monomer.

As the cocatalyst, alkylaluminoxane, alkylaluminum and the like are cited. In particular, it can be exemplified by: methylaluminoxane (MAO); trialkylaluminums such as trimethylaluminum, triethylaluminum, tripropylaluminum, triisopropylaluminum, triisobutylaluminum, tri-2-methylbutylaluminum, tri-3-methylbutylaluminum, tri-2-methylpentylaluminum, tri-3-methylpentylaluminum, tri-4-methylpentylaluminum, tri-2-methylhexylaluminum, tri-3-methylhexylaluminum, trioctylaluminum and the like; dialkylaluminum halides such as dimethylaluminum chloride, diethylaluminum chloride, diisopropylaluminum chloride, diisobutylaluminum chloride and the like; monoalkylaluminum halides such as methylaluminum dichloride, ethylaluminum dichloride, ethylaluminum diiodide, propylaluminum dichloride, isopropylaluminum dichloride, butylaluminum dichloride, isobutylaluminum dichloride and the like; and alkylaluminum sesquichlorides such as methylaluminum sesquichloride, ethylaluminum sesquichloride, propylaluminum sesquichloride, isobutylaluminum sesquichloride and the like. The amount of the cocatalyst is within a range of from 50 to 500 equivalents in terms of Al conversion, in the case of methylaluminoxane. In the case of other alkylaluminums, the amount is within a range of 100 equivalents or less, preferably 30 equivalents or less by molar ratio relative to the transition metal catalyst.

Additionally, the polymerization solvent will do as long as it does not interfere with the polymerization reaction, and representative ones are exemplified by aromatic hydrocarbon-based ones such as benzene, toluene, xylene, chlorobenzene, dichlorobenzene and the like, hydrocarbon-based ones such as hexane, heptane, cyclohexane and the like, halogenated hydrocarbon-based ones such as carbon tetrachloride, chloroform, methylene chloride, 1,2-dichloroethane and the like, dimethylformamide, N-methylpyrolidone, N-cyclohexylpyrolidone and the like. Additionally, these solvents may be used singly or in combination of two or more kinds. The reaction temperature is preferably −70 to 200° C. in general, particularly preferably −40 to 80° C.

As a method of removing an organic solvent or water, which serve as mediums, from a solution or dispersion liquid of the thus obtained fluorinated polymer of the present invention, any known method can be used. If these are exemplified, methods such as reprecipitation filtration, heating distillation under reduced pressure and the like are cited.

Concerning the number average molecular weight of the fluorinated polymer relating to the top coat composition of the present invention, a range of from 1,000 to 100,000, preferably from 3,000 to 50,000 is appropriate. The molecular weight distribution is 1 to 4, preferably 1 to 2.5.

In the use of the top coat, solubility and casting property may be changed according to the molecular weight. There is a possibility that a polymer is decreased in dissolution rate in the developing solution with high molecular weight while being increased in the dissolution rate in the case of low molecular weight; however, it is possible to control the molecular weight by suitably adjusting polymerization conditions on the basis of common sense in this technical field.

The fluorinated polymer of the present invention contains an aliphatic structure and a hexafluoroisopropyl hydroxyl group bonded to the ring thereby exhibiting a property of being extremely low in absorbance at 300 nm or less wavelengths. It is therefore possible to use a high-energy ray having 300 nm or less wavelengths, when conducting exposure.

Additionally, the fluorinated polymer used for the top coat composition of the present invention has an aliphatic structure and therefore provides a relatively high glass transition temperature (Tg). Low glass transition temperature (Tg) gives rise to dispersion of resist compositions into a top coat layer, which is not preferable. The Tg of the fluorinated polymer of the present invention is not lower than 120° C., which is higher than a bake temperature (100° C.) while depending on a component intended to copolymerize, so that the dispersion is suppressed.

The top coat composition of the present invention is used after dissolving the above-produced fluorinated polymer in an organic solvent or a mixture liquid of water and the organic solvent. An essential condition for the organic solvent usable therefor is that the solvent behaves as a solvent having difficulties in eroding a resist film disposed as underlayer and in extracting an additive and the like from the resist film.

As the solvent having difficulties in eroding the resist film and in extracting the additive from the resist film, it is possible to cite hydrocarbon-based solvents, alcohol, ether, ester, fluorine-based solvents and the like, though it depends on a composition of the resist film disposed as underlayer.

Concretely, it is preferable to adopt alkanes such as pentane, hexane, heptanes, octane, nonane and decane, aliphatic hydrocarbon solvents and alcohols such as butanol (normal, iso and tertiary forms), methyl ethyl carbinol, pentanol, amyl alcohol, hexyl alcohol, heptyl alcohol and 4-methyl-2-pentanol, and more preferably hydrocarbon-based solvents having a part substituted with fluorine. The hydrocarbon-based solvents having a part substituted with fluorine are alkanes, aliphatic hydrocarbons or alcohols, and it is possible to adopt these of which hydrogen atoms are partially substituted with fluorine atoms. By introducing fluorine atoms, it becomes possible to dissolve a polymer compound of the present invention efficiently and to accomplish such a coating as not to damage the foundation resist film.

As will be discussed below, the top coat composition is applied onto the resist film by spin coating method. It is therefore preferable, in relation to handling, that a solvent therefor has a boiling point within an appropriate range for spin coating method, i.e., a boiling point of from about 70 to 170° C.

Of the above-mentioned solvents, hydrocarbons or alcohols having a specified number of carbon atoms are preferable, in relation to the boiling point. An excessively small number of carbon atoms decreases the boiling point to less than 70° C. and an excessively large number of carbon atoms increases the boiling point beyond 170° C., which are not suitable for spin coating method.

As the solvent, it is preferable to employ; a single organic solvent selected from the group consisting of alkane or aliphatic hydrocarbon having 5 to 20 carbon atoms, hydrocarbon-based alcohol having 1 to 20 carbon atoms, and those obtained by partially substituting the above hydrocarbon or hydrocarbon-based alcohol with fluorine; or a mixture solvent of two or more kinds of these.

More preferably, it is possible to cite; a single organic solvent selected from the group consisting of alkane or aliphatic hydrocarbon having 5 to 10 carbon atoms, hydrocarbon-based alcohol having 1 to 10 carbon atoms, and those obtained by partially substituting the above hydrocarbon or hydrocarbon-based alcohol with fluorine; and a mixture solvent of two or more kinds of these.

With regard to the composition of the hydrocarbon and the hydrocarbon-based alcohol providing a boiling point suitable for spin coating method, a solvent obtained by mixing 50% to lower than 99.9% of the hydrocarbon having 5 to 20 carbon atoms and 0.1% to lower than 50% of the hydrocarbon-based alcohol having 1 to 20 carbon atoms is preferable.

More preferably, there can be cited a solvent obtained by mixing 50% to lower than 99.9% of the hydrocarbon having 5 to 10 carbon atoms and 0.1% to lower than 50% of the hydrocarbon-based alcohol having 1 to 10 carbon atoms.

The amount of the solvent to be mixed is not particularly limited; however, it is preferable to use the solvent in such a manner that the solid content of the top coat composition is 3 to 25%, more preferably 5 to 15%. By adjusting the solid content of the top coat composition, it becomes possible to adjust the film thickness of a resinous film to be formed.

Additionally, in the present invention, there are preferably used a hydrophobicity-providing agent for suppressing an influence upon swelling or penetration of water, an acidity-providing agent for enhancing solubility in the developing solution.

The top coat composition according to the present invention can be used without a particular limitation in the kind of the resist disposed as underlayer. More specifically, it is preferably used even if the resist disposed as underlayer establishes any resist system of a negative type, positive type, complex type and the like.

The wavelength adopted in exposure is not particularly limited; however, it is preferable to use a high-energy ray having 300 nm or less wavelengths, preferably KrF excimer laser (248 nm), ArF excimer laser (193 nm), $F_2$ laser (157 nm), EUV, EB or X-rays. The ArF excimer laser is particularly preferably adopted.

Additionally, the top coat composition of the present invention is preferably applied in immersion lithography in particular.

Hereinafter, the case of using the present invention in production of a device (a semiconductor device) applying immersion lithography will be discussed. The device is not particularly limited but exemplified by semiconductor devices produced through a microfabrication, such as CPU, SRAM, DRAM and the like formed on silicon wafers, compound semiconductor substrates, insulation substrate or the like.

First of all, a solution of a resist composition is applied onto a support member such as a silicon wafer and a semiconductor production substrate by using a spinner or the like, followed by conducting a prebake, thereby forming a resist layer. Conditions relating to this step may be suitably determined according to the composition of the resist composition.

Thereafter, a solution of the top coat composition of the present invention is applied to a surface of the resist film formed as discussed above, followed by heat treatment. With this, a resinous film comprised of a two-layer film in which a top coat layer is coated on the resist layer is formed.

The substrate on which the resinous film is formed is impregnated with a medium such as water, followed by conducting irradiation with a high-energy ray having 300 nm or less wavelengths through a desired mask pattern. With this, the exposure light penetrates the medium (e.g., water) and the top coat layer so as to reach the resist layer. Since the resist layer is separated from the medium (e.g., water) by the top coat layer, the resist layer is not impregnated with the medium (e.g., water) so as to never cause swelling, and additionally never dissolves in the medium (e.g., water).

After baking the exposure substrate, developing treatment is performed in the use of a developing solution, for example, an alkali aqueous solution such as a 0.1 to 10 wt % tetramethylammonium hydroxide aqueous solution. In developing treatment, the top coat layer is entirely dissolved as a first step, and then the resist film is dissolved at its exposure portion. In other words, it is possible to dissolve and remove the top coat layer and a part of the resist layer and to obtain a resist pattern according to the desired mask pattern, with onetime developing treatment.

EXAMPLES

The present invention will be hereinafter explained in detail with reference to examples. However, the present invention is not limited by the following examples.

Monomer Synthesis Example 1

Synthesis of Compound 4 (MA3-4OH)

(1) Synthesis of Compound 2: 1-(1,1,1,3,3,3-hexafluoro-2-hydroxy-2-propyl)-2,5-dihydroxybenzene

[Chemical Formula 17]

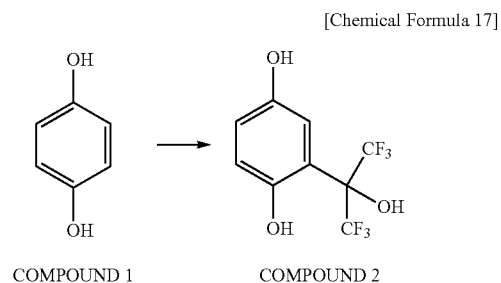 [SMILES: Oc1ccc(O)cc1 ; Oc1ccc(O)c(C(O)(C(F)(F)F)C(F)(F)F)c1]

COMPOUND 1     COMPOUND 2

A pressure-resistant reactor with 2,000 ml of inner capacity, having a stirrer and a thermometer and formed of SUS316, was charged with 200 g (1.82 mol) of hydroquinone (Compound 1), 17.3 g (0.091 mol) of p-toluenesulfonic acid and 600 ml of toluene, and then closed. Thereafter, the reactor was deaerated by a vacuum pump, followed by introducing 332 g (2.00 mol) of 1,1,1,3,3,3-hexafluoroacetone thereinto with stirring. The temperature of the reactor was increased and stirring was continued at 100° C. for 30 hours.

After termination of the reaction, the content was retrieved and 400 ml of diisopropyl ether and 400 ml of water were added thereto, followed by stirring. It was set aside to separate an organic layer therefrom, and the organic layer was rinsed with 200 ml of saturated brine two times. The obtained solution was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 370 g of 1-(1,1,1,3,3,3-hexafluoro-2-hydroxy-2-propyl)-2,5-dihydroxybenzene (Compound 2). The yield was 72%.

¹H-NMR (Solvent: Deuterated acetone, Standard Substance: TMS); (ppm) 6.82-7.05 (3H, m), 8.87 (3H, bs)

¹⁹F-NMR (Solvent: Deuterated acetone, Standard Substance: CCl₃F); δ (ppm)-75.05 (6F, s)

(2) Synthesis of Compound 3: (1,1,1,3,3,3-hexafluoro-2-hydroxy-2-propyl)-2,5-dihydroxycyclohexane

[Chemical Formula 18]

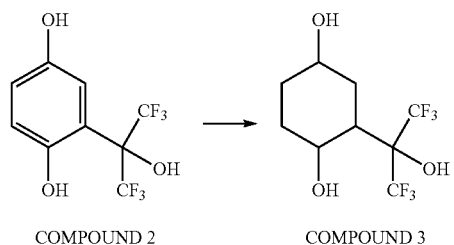

COMPOUND 2 → COMPOUND 3

A pressure-resistant reactor with 2,000 ml of inner capacity, having a stirrer and a thermometer and formed of SUS316, was charged with 800 ml of diisopropyl ether, 350 g (1.27 mol) of Compound 2 and 17.5 g of 5% Ru/C (a product containing 50% of water, produced by N.E. CHEMCAT), and then closed. Thereafter, stirring was started and then the interior of the reactor was substituted with hydrogen, followed by setting hydrogen pressure at 3.0 MPa. The temperature of the reactor was increased and stirring was continued at 130° C. for 20 hours.

After termination of the reaction, the content was retrieved and a catalyst was separated by filtration in the use of sellite. The obtained filtrate was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 283 g of 1-(1,1,1,3,3,3-hexafluoro-2-hydroxy-2-propyl)-2,5-dihydroxycyclohexane (Compound 3). The yield was 79%. Compound 3 was obtained mainly in the form of a mixture of two kinds of isomers (Compound 3A: Compound 3B=64: 36).

Compound 3A:

¹H-NMR (Solvent: Deuterated acetone, Standard Substance: TMS); δ (ppm) 1.20-2.80 (7H, m), 3.82 (1H, s), 4.17 (1H, s), 4.61 (1H, s), 5.20 (1H, s), 7.29 (1H, s)

¹⁹F-NMR (Solvent: Deuterated acetone, Standard Substance: CCl₃F); δ (ppm) −71.25 (3F, q, J=12 Hz), −73.86 (3F, q, J=12 Hz)

Compound 3B:

¹H-NMR (Solvent: Deuterated acetone, Standard Substance: TMS); δ (ppm) 1.20-2.80 (7H, m), 3.63 (1H, s), 3.95 (1H, s), 4.54 (1H, s), 5.24 (1H, s), 7.29 (1H, s)

¹⁹F-NMR (Solvent: Deuterated acetone, Standard Substance: CCl₃F); δ(ppm) −71.25 (3F, q, J=12 Hz), −73.86 (3F, q, J=12 Hz)

(3) Synthesis of Compound 4 (MA3-4OH): (1,1,1,3,3,3-hexafluoro-2-hydroxy-2-propyl)-2-hydroxycyclohex-5-yl methacrylate

[Chemical Formula 19]

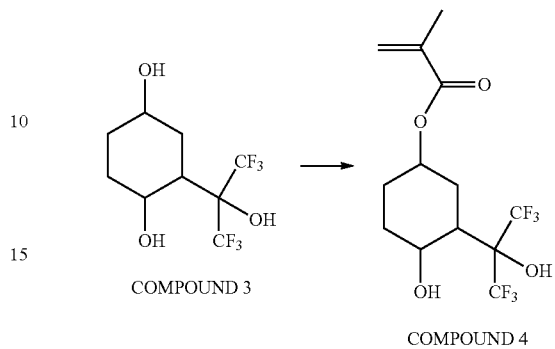

COMPOUND 3 → COMPOUND 4

A 3,000 ml four-neck flask having a stirrer, a thermometer and a reflux condenser was charged with 270 g (0.96 mol) of Compound 3, toluene (1,200 ml), 18.4 g (0.191 mol) of methanesulfonic acid and 155 g (1.01 mol) of methacrylic anhydride, followed by stirring at 70° C. for 4 hours.

After termination of the reaction, a reaction liquid was retrieved. Upon the addition of 800 ml of diisopropyl ether, it was rinsed with a sodium hydrogencarbonate aqueous solution and saturated brine in this order. The obtained solution was concentrated and then heated up to 70° C. upon the addition of 600 ml of a 1:2 mixture solvent of toluene and heptane, followed by allowing it to cool slowly to cause recrystallization. A crystal was filtered out and dried, thereby obtaining 1-(1,1,1,3,3,3-hexafluoro-2-hydroxy-2-propyl)-2-hydroxycyclohex-5-yl methacrylate (Compound 4; MA3-4OH, 113 g). The yield was 34%.

¹H-NMR (Solvent: CDCl₃, Standard Substance: TMS); δ (ppm) 1.95 (3H, s), 1.55-2.60 (8H, m), 4.71 (1H, s), 5.27 (1H, s), 5.58 (1H, s), 5.94 (1H, s), 6.08 (1H, s)

¹⁹F-NMR (Solvent: CDCl₃, Standard Substance: CCl₃F); δ (ppm) −72.42 (3F, q, J=12 Hz), −74.72 (3F, q, J=12 Hz)

Monomer Synthesis Example 2

Synthesis of Compound 8 (MA4-3OH)

(1) Synthesis of Compound 6: 1-(1,1,1,3,3,3-hexafluoro-2-hydroxy-2-propyl)-2,4-dihydroxybenzene

[Chemical Formula 20]

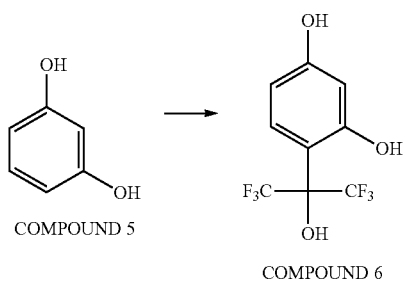

COMPOUND 5 → COMPOUND 6

Compound 5 (resorcinol) was prepared as a raw material and reacted with 1,1,1,3,3,3-hexafluoroacetone, thereby synthesizing 1-(1,1,1,3,3,3-hexafluoro-2-hydroxy-2-propyl)-2,4-dihydroxybenzene (Compound 6). Incidentally, the synthesis was carried out by a method set forth in the following Non-Patent Publication 2.
"Non-Patent Publication 2"
Basil S. Farah, Everett E. Gilbert, Morton Litt, Julian A. Otto, John P. Sibilia, J. Org. Chem., 1965, 30(4), pp 1003-1005

(2) Synthesis of Compound 7: 1-(1,1,1,3,3,3-hexafluoro-2-hydroxy-2-propyl)-2,4-dihydroxycyclohexane

[Chemical Formula 21]

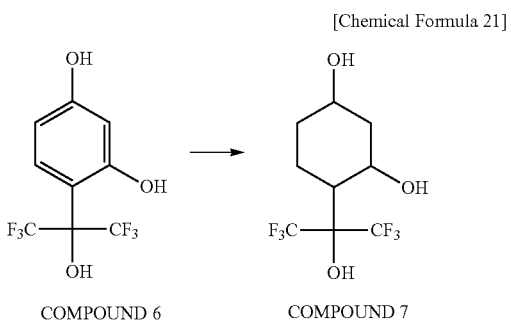 [SMILES: Oc1ccc(C(O)(C(F)(F)F)C(F)(F)F)c(O)c1 ; OC1CCC(C(O)(C(F)(F)F)C(F)(F)F)C(O)C1]

COMPOUND 6     COMPOUND 7

A pressure-resistant reactor with 2,000 ml of inner capacity, having a stirrer and a thermometer and formed of SUS316, was charged with 800 ml of diisopropyl ether, 350 g (1.27 mol) of Compound 6 and 17.5 g of 5% Ru/C (a product containing 50% of water, produced by N.E. CHEMCAT), and then closed. Thereafter, stirring was started and then the interior of the reactor was substituted with hydrogen, followed by setting hydrogen pressure at 3.0 MPa. The temperature of the reactor was increased and stirring was continued at 130° C. for 20 hours.

After termination of the reaction, the content was retrieved and a catalyst was separated by filtration in the use of sellite. The obtained filtrate was concentrated and then heated up to 80° C. upon the addition of 800 ml of a 1:2 mixture solvent of toluene and heptane, followed by allowing it to cool slowly to cause recrystallization. A crystal was filtered out and dried, thereby obtaining 315 g of 1-(1,1,1,3,3,3-hexafluoro-2-hydroxy-2-propyl)-2,4-dihydroxycyclohexane (Compound 7). The yield was 88%.

(3) Synthesis of Compound 8 (MA4-3OH): 1-(1,1,1,3,3,3-hexafluoro-2-hydroxy-2-propyl)-2-hydroxycyclohex-4-yl methacrylate

[Chemical Formula 22]

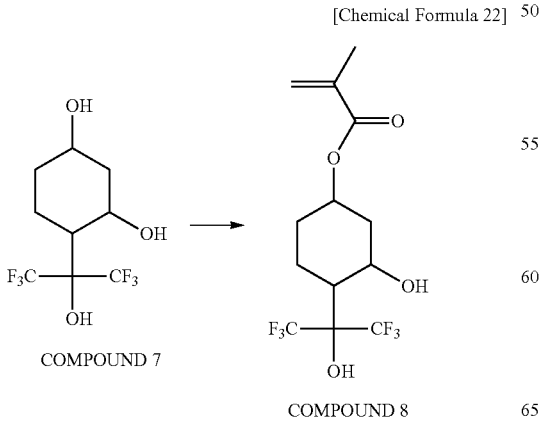

COMPOUND 7     COMPOUND 8

A 3,000 ml four-neck flask having a stirrer, a thermometer and a reflux condenser was charged with 270 g (0.96 mol) of Compound 7, toluene (1,200 ml), 18.4 g (0.191 mol) of methanesulfonic acid and 155 g (1.01 mol) of methacrylic anhydride, followed by stirring at 70° C. for 4 hours.

After termination of the reaction, a reaction liquid was retrieved. Upon the addition of 800 ml of diisopropyl ether, it was rinsed with a sodium hydrogencarbonate aqueous solution and saturated brine in this order. The obtained solution was concentrated and then heated up to 70° C. upon the addition of 600 ml of a 1:2 mixture solvent of toluene and heptane, followed by allowing it to cool slowly to cause recrystallization. A crystal was filtered out and dried, thereby obtaining 131 g of 1-(1,1,1,3,3,3-hexafluoro-2-hydroxy-2-propyl)-2-hydroxycyclohex-4-yl methacrylate (Compound 8; MA4-3OH). The yield was 39%.

$^1$H-NMR (Solvent: CDCl$_3$, Standard Substance: TMS); δ (ppm) 1.98 (3H, s), 1.65-2.29 (7H, m), 3.53 (1H, bs), 4.68 (1H, s), 5.29 (1H, s), 5.66 (1H, s), 6.07 (1H, s), 6.50 (1H, bs)

$^{19}$F-NMR (Solvent: CDCl$_3$, Standard Substance: C$_8$F$_6$); δ (ppm) 87.12 (3F, q, J=11.3 Hz), 89.70 (3F, q, J=11.3 Hz)

IR (ATR method): ν=3387, 1685, 1269, 1200, 1151, 1136, 1107, 1095, 979, 952 cm$^{-1}$ GC-MS (FI$^+$ method): m/e 350 (M$^+$)

Polymer Synthesis Example 1

Polymer 1: Homopolymer of Compound 4 (MA3-4OH)

The molecular weight (the number average molecular weight Mn) and the molecular weight distribution (the ratio between Mn and the weight average molecular weight Mw, represented by Mw/Mn) was measured by HLC-8320GPC produced by TOSOH CORPORATION, in such a manner as to connect one each of an ALPHA-M column and an ALPHA-2500 column produced by TOSOH CORPORATION in series and to use tetrahydrofuran as a developing solvent. As a detector, a differential refractive index detector was adopted. Results thereof are shown in Table 1. Additionally, the composition of the copolymer was determined by $^1$H-NMR and $^{19}$F-NMR, and a result thereof is shown in the "Composition (Repeating Unit)" section of Table 1. The same goes to the other polymers.

[Chemical Formula 23]

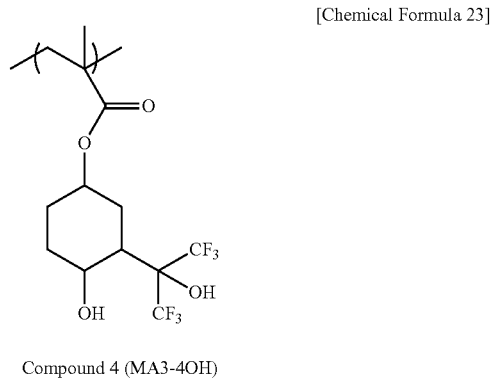

Compound 4 (MA3-4OH)

In a glass flask, 40.0 g of Compound 4 (MA3$^{-40}$H) and 0.65 g of n-dodecyl mercaptan (produced by TOKYO CHEMICAL INDUSTRY CO., LTD.) were dissolved in 80.0 g of 2-butanone. To this solution, 1.65 g of AIBN (2,2'-azobis (isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 600.0 g of n-heptane, thereby obtaining a white precipitate. The precipitate was filtered out and dried under a reduced pressure at 60° C., thereby obtaining 32.0 g of a white solid (Polymer 1).

GPC measurement result; Mn=16,600, Mw/Mn=2.1

Polymer Synthesis Example 2

Polymer 2: Homopolymer of Compound 8 (MA4-3OH)

[Chemical Formula 24]

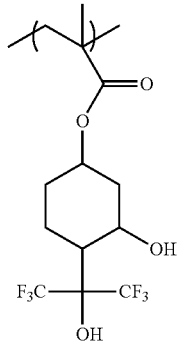

In a glass flask, 40.0 g of Compound 8 (MA4-3OH) and 0.65 g of n-dodecyl mercaptan (produced by TOKYO CHEMICAL INDUSTRY CO., LTD.) were dissolved in 80.0 g of 2-butanone. To this solution, 1.65 g of AIBN (2,2'-azobis (isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 600.0 g of n-heptane, thereby obtaining a white precipitate. The precipitate was filtered out and dried under a reduced pressure at 60° C., thereby obtaining 35.2 g of a white solid (Polymer 2) (The yield was 88%).

GPC measurement result; Mn=18,700, Mw/Mn=1.6

Polymer Synthesis Example 3

Polymer 3: Copolymer of Compound 8/MA-ECp

[Chemical Formula 25]

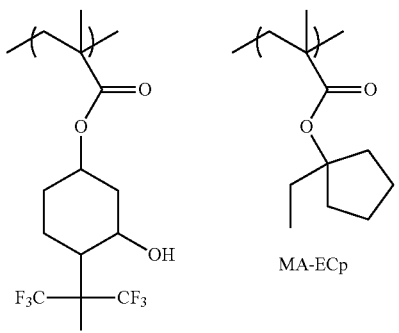

COMPOUND 8

In a glass flask, 25.1 g of Compound 8 (MA4-3OH), 7.2 g of 1-ethyl-1-cyclopentane methacrylate (MA-ECp), and 0.45 g of n-dodecyl mercaptan (produced by TOKYO CHEMICAL INDUSTRY CO., LTD.) were dissolved in 64.6 g of 2-butanone. To this solution, 1.3 g of AIBN (2,2'-azobis (isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 500.0 g of n-heptane, thereby obtaining a white precipitate. The precipitate was filtered out and dried under a reduced pressure at 60° C., thereby obtaining 23.0 g of a white solid (Polymer 2) (The yield was 71%).

GPC measurement result; Mn=11,200, Mw/Mn=2.2

Polymer Synthesis Example 4

Comparative Polymer 1: Homopolyer of Compound 9 (MA4)

[Chemical Formula 26]

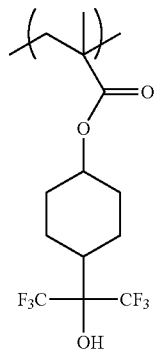

COMPOUND 9 (MA-4)

In a glass flask, 42.0 g of 1-(1,1,1,3,3,3-hexafluoro-2-hydroxy-2-propyl)cyclohex-4-yl methacrylate (Compound 9; MA4) and 0.68 g of n-dodecyl mercaptan (produced by TOKYO CHEMICAL INDUSTRY CO., LTD.) were dissolved in 84.0 g of 2-butanone. To this solution, 1.71 g of AIBN (2,2'-azobis(isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 630.0 g of n-heptane, thereby obtaining a white precipitate. The precipitate was filtered out and dried under a reduced pressure at 60° C., thereby obtaining 34.0 g of a white solid (Comparative Polymer 1 for top coat) (The yield was 81%).

GPC measurement result; Mn=17,000, Mw/Mn=1.9

Polymer Synthesis Example 5

Comparative Polymer 2: Homopolyer of Compound 10 (MA35)

[Chemical Formula 27]

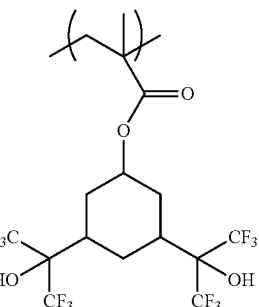

COMPOUND 10 (MA35)

In a glass flask, 45.0 g of 1,3,3,3-hexafluoro-2-hydroxy-2-propyl)cyclohex-4-yl methacrylate (Compound 10; MA35) and 0.70 g of n-dodecyl mercaptan (produced by TOKYO CHEMICAL INDUSTRY CO., LTD.) were dissolved in 90.0 g of 2-butanone. To this solution, 1.83 g of AIBN (2,2'-azobis (isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 675.0 g of n-heptane, thereby obtaining a white precipitate. The precipitate was filtered out and dried under a reduced pressure at 60° C., thereby obtaining 34.2 g of a white solid (Comparative Polymer 2 for top coat) (The yield was 76%).

GPC measurement result; Mn=9,400, Mw/Mn=1.6

Polymer Synthesis Example 6

Polymer for resist: Resist 1

[Chemical Formula 28]

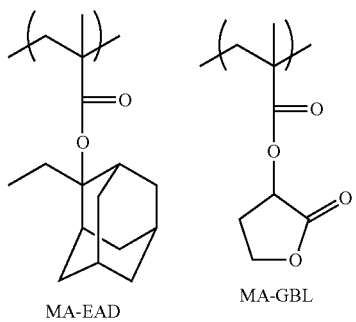

MA-EAD    MA-GBL

MA-HAD

In a glass flask, 12.0 g of hydroxyadamantyl methacrylate (MA-HAD), 10.8 g of ethyladamantyl methacrylate (MA-EAD) and 10.1 g of γ-butyrolactone methacrylate (MA-GBL), which were prepared as monomers, and 0.54 g of n-dodecyl mercaptan (produced by TOKYO CHEMICAL INDUSTRY CO., LTD.) as a chain transfer agent were dissolved in 65.8 g of 2-butanone serving as a solvent. To this solution, 1.35 g of AIBN (2,2'-azobis(isobutyronitrile) produced by Wako Pure Chemical Industries, Ltd.) was added as a polymerization initiator, upon which deaeration was carried out with stirring. Then, nitrogen gas was introduced thereinto, followed by conducting a 16 hours of reaction at 75° C. A solution obtained after the reaction terminated was added dropwise to 500.0 g of n-heptane, thereby obtaining a white precipitate. The precipitate was filtered out and dried under a reduced pressure at 60° C., thereby obtaining 29.6 g of a white solid (Polymer for resist) (The yield was 90%).

GPC measurement result; Mn=11,500, Mw/Mn=2.1

Results obtained by measurements are shown in Table 1.

TABLE 1

| No. | Polymer | Composition (Repeating Unit) (mol %) | | | Molecular weight | | |
|---|---|---|---|---|---|---|---|
| | | | | | Mw | Mw/Mn | Yield (%) |
| Polymer Synthesis Example 1 | Polymer 1 | Compound 4 (MA3-4OH) 100 | — | — | 16,600 | 2.1 | 80 |
| Polymer Synthesis Example 2 | Polymer 2 | Compound 8 (MA4-3OH) 100 | — | — | 18,750 | 1.6 | 88 |
| Polymer Synthesis Example 3 | Polymer 3 | Compound 8 (MA4-3OH) 65 | MA-ECp 35 | — | 11,200 | 2.2 | 71 |
| Polymer Synthesis Example 4 | Comparative Polymer 1 | Compound 9 (MA4) 100 | — | — | 17,000 | 1.9 | 81 |
| Polymer Synthesis Example 5 | Comparative Polymer 2 | Compound 10 (MA35) 100 | — | — | 9,400 | 1.6 | 76 |
| Polymer Synthesis Example 6 | Resist Polymer | MA-HAD 30 | MA-EAD 35 | MA-GBL 35 | 11,500 | 2.1 | 90 |

Hereinafter, evaluations as a top coat composition will be discussed.

Examples 1 to 4, Comparative Examples 1 and 2

Preparation of Top Coat Composition

Polymers obtained by Polymer Synthesis Examples 1 to 5 were prepared by being dissolved in solvents at ratios as shown in the sections of Examples 1 to 4, Comparative Examples 1, Comparative Example 2 of Table 2. As a result, uniform and transparent top coat solutions (Top Coat 1-1, Top Coat 1-2, Top Coat 2, Top Coat 3, Comparative Top Coat 1 and Comparative Top Coat 2) were obtained.

Each of the top coat solutions was filtered through a membrane filter (0.2 µm) and then applied onto a silicon wafer previously subjected to an antireflective film-forming treatment (in which ARC29A (78 nm) produced by Nissan Chemical Industries, Ltd. was applied thereon and then calcined at 200° C. for 60 seconds), with a spinner, at a rotation speed of 1,500 rpm, followed by drying the wafer on a hot plate of 100° C. for 90 seconds. Thus, a uniform resinous film was obtained in each of the examples (Examples 1 to 4, Comparative Examples 1 and 2).

Preparation of Resist

Polymer for Resist, obtained by Polymer Synthesis Example 6, was dissolved in propylene glycol monomethyl ether acetate (PGMEA) thereby preparing it to have a solid content of 12%. In addition to this, 5 parts by weight of triphenylsulfonium nonafluorobutanesulfonate as an acid generator and 2 parts by weight of isopropanolamine as a base, relative to 100 parts by weight of the polymer, were dissolved thereby preparing a resist solution. The resist solution was applied on a silicon wafer previously subjected to an antireflective film-forming treatment, and then dried, as discussed in Example 1, on the same conditions, thereby forming a resist film (Reference Example 1).

Solubility in Solvent

A top coat solution and a resist composition were prepared by using solvents shown in Table 2 as discussed above, in such a manner as to adjust formulations in the top coat solution and the resist composition. Either of them exhibited an excellent solubility. Results are shown in Table 2.

Receding Contact Angle

The resinous films obtained by Examples 1 to 4 and Comparative Examples 1 and 2 and the resist film obtained by Polymer Synthesis Example 6 were measured in terms of receding contact angle. A receding contact angle of waterdrop was measured by using a dynamic contact angle meter (produced by Kyowa Interface Science Co., Ltd.) and adopting an extension/contraction method. A droplet having an initial size of 7 µL was subjected to aspiration for 8 seconds at a rate of 6 µL/sec, and a stable value of the dynamic contact angle obtained during the aspiration was defined as a receding contact angle. Results thereof are shown in Table 2.

The top coats formed by mixing the fluorinated polymers thereinto, and Comparative Top Coats 1 and 2 provided receding contact angles of not smaller than 50°. With this, it was found that the resinous films had a tendency to be high in receding contact angle as compared with the resist film (Reference Example 1; 47°).

Solubility in Developing Solution

The resinous films obtained by Examples 1 to 4, Comparative Examples 1 and 2 were immersed in 2.38 wt % tetramethylammonium hydroxide aqueous solution (a developing solution) at room temperature for 60 seconds. As a result, the films promptly dissolved and disappeared, except for the case of using Comparative Top Coat 1. Incidentally, as result of measuring the resist film obtained by Reference Example 1 in the similar manner, dissolution of the film was not observed since the film was unexposed.

TABLE 2

| No. | Top Coat or Resist | Polymer (part by weight) | Photoacid Generator (part by weight) | Basic Substance (part by weight) | Solvent (part by weight) | Solubility in Solvent | Receding Contact Angle (°) | Solubility in Developing Solution |
|---|---|---|---|---|---|---|---|---|
| Example 1 | Top Coat 1-1 | Polymer 1 (100) | — | — | Solvent 1 (900) | Soluble | 50 | Soluble |
| Example 2 | Top Coat 1-2 | Polymer 1 (50) | — | — | Solvent 2 (950) | Soluble | 53 | Soluble |
| Example 3 | Top Coat 2 | Polymer 2 (100) | — | — | Solvent 1 (900) | Soluble | 66 | Soluble |
| Example 4 | Top Coat 3 | Polymer 3 (100) | — | — | Solvent 1 (900) | Soluble | 66 | Soluble |
| Comparative Example 1 | Comparative Top Coat 1 | Comparative Polymer 1 (100) | — | — | Solvent 1 (900) | Soluble | 64 | Insoluble |
| Comparative Example 2 | Comparative Top Coat 2 | Comparative Polymer 2 (50) | — | — | Solvent 2 (950) | Soluble | 63 | Soluble |
| Reference Example 1 | Resist | Polymer 3 (100) | PAG (5) | Base (1) | Solvent 3 (900) | Soluble | 47 | Insoluble (Unexposed) |

PAG: Triphenylsulfonium nonafluorobutanesulfonate

Base: Isopropanolamine

Solvent 1: 4-Methyl-2-pentanol (MIBC)

Solvent 2: n-Decane/2-octanol (90/10)

Solvent 3: Propylene glycol monomethyl ether acetate (PGMEA)

Examples 5 to 8, Comparative Examples 3 and 5

The resist solution prepared in Reference Example 1 and the top coat solution prepared in Examples 1 to 4 and Comparative Examples 1 and 2 underwent the following process, thereby forming resinous films each comprised of a two-layer film having a resist layer and a top coat layer on a silicon wafer.

Resinous Film-Forming Process (Application of Resist Composition and Application of Top Coat Solution)

The resist solution obtained by Reference Example 1 was applied on a silicon wafer by spin coating with a spinner, followed by drying it on a hot plate of 100° C. for 90 seconds, thereby obtaining a resist film having a film thickness of 150 nm. Onto the resist film, a solution of Top Coat 1-1 filtered through a membrane filter (0.2 μm) was applied by spin coating with a spinner. Then, the film was dried on a hot plate of 100° C. for 90 seconds, thereby forming a resinous film having a total film thickness of 200 nm (a two-layer film having a resist layer and a top coat layer).

A solution of each of Top Coat 1-2, 2 and 3 and Comparative Top Coat 1 and 2 was applied to a silicon wafer on which a resist film was formed, in the same manner, thereby obtaining a resinous film having a total film thickness of 200 nm (a two-layer film having a resist layer and a top coat layer).

The resinous film formed on the silicon wafer received a pure water-immersion treatment, an examination of solubility of the top coat layer in an alkali developing solution and an exposure resolution examination, as discussed below. Results of these examinations are shown in Table 3.

Pure Water-Immersion Examination

Each of 20 silicon wafers on which the resinous films were formed by the above-mentioned manner was immersed in 20 ml of pure water for 10 minutes to extract a dissolved substance. Then, the extract liquid was measured by ion chromatography to confirm the presence of the dissolved substance. With the exception of the silicon wafer on which the top coat was not formed (Comparative Example 3), peaks that reside in a photoacid generator and a decomposed substance thereof did not observed. This indicated that a resist component was prevented from being dissolved from the resist film into water.

Examination of Solubility of Top Coat Layer in Alkali Developing Solution

Silicon wafers to which resists were applied thereby forming resinous films thereon were immersed in an alkali developing solution (2.38 wt % tetramethylammonium hydroxide aqueous solution) at room temperature, upon which their dissolution rates were measured by using a resist development analyzer RDA-790 (produced by Litho Tech Japan Corporation). Results thereof are shown in Table 3.

Comparative Example 4 was insoluble in the alkali developing solution and Comparative Example 5 was extremely high in dissolution rate in the alkali developing solution, while the top coats of Examples 5 to 8 each exhibited a dissolution rate generally intermediate therebetween.

Exposure Resolution Examination

Silicon wafers to which resinous films were formed by applying top coat solutions to resist films were subjected to a prebake of 100° C. for 90 seconds, followed by exposure to light with a wavelength of 193 nm through a photomask. Thereafter, a post exposure bake was performed at 120° C. for 60 seconds, thereby conducting development with an alkali developing solution. As the alkali developing solution, 2.38 wt % tetramethylammonium hydroxide aqueous solution was used.

The thus obtained patterns were observed by a scanning electron microscope (SEM), followed by carrying out evaluations in terms of the resolution performance. Results thereof are shown in Table 3.

In Examples 5 to 8 employing Top Coat 1-1, Top Coat 1-2, Top Coat 2 and Top Coat 3, a pattern having a rectangular shape was formed. On the other hand, it was observed that Comparative Example 4 employing Comparative Top Coat 1 formed a pattern having an outstretched-head shape and a residue (the pattern was considered inferior in solubility). Additionally, in Comparative Example 5 employing Comparative Top Coat 2, there were observed a film-thinning at an unexposed portion considered derived from an excessive resolution performance, and a pattern of a rounded-head shape. Incidentally, a pattern observed in Comparative Example 3 having no top coat was disturbed in shape because of adhesion between lines, which was considered brought about by swelling.

TABLE 3

| No. | Top Coat Composition | Pure Water-Immersion Examination | Solubility of Top Coat Layer in Alkali Developing Solution | Resolution Performance of Resist Layer |
|---|---|---|---|---|
| Example 5 | Top Coat 1-1 | ○ | 800 nm/sec | Rectangularly shaped pattern |
| Example 6 | Top Coat 1-2 | ○ | 400 nm/sec | Rectangularly shaped pattern |
| Example 7 | Top Coat 2 | ○ | 200 nm/sec | Rectangularly shaped pattern |
| Example 8 | Top Coat 3 | ○ | 100 nm/sec | Rectangularly shaped pattern |
| Comparative Example 3 | None | x | — | Not good at pattern formation because of remarkably outstretched-head shape |
| Comparative Example 4 | Comparative Top Coat 1 | ○ | Insoluble | Not good at pattern formation because of residue on surface |
| Comparative Example 5 | Comparative Top Coat 2 | ○ | 1500 nm/sec | Pattern having film-thinning in resist layer |

Pure Water-Immersion Examination:

○; Dissolution of resist component occurred x; Dissolution of resist component did not occur

The invention claimed is:

1. A top coat composition formed on a resist film to protect the resist film, comprising:
a fluorinated polymer including at least one of repeating units represented by the following general formulas (6) to (8)

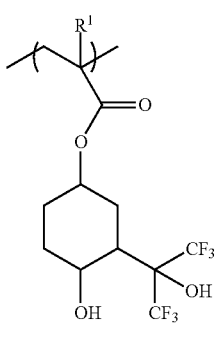
(6)

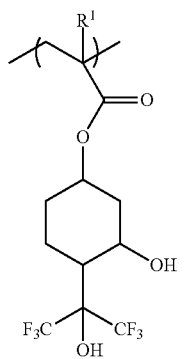
(7)

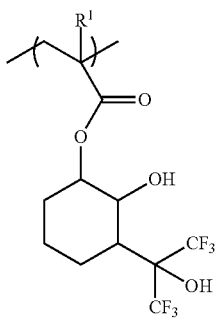
(8)

where $R^1$ represents a hydrogen atom, methyl group, fluorine atom, or trifluoromethyl group.

2. A top coat composition as claimed in claim 1, wherein the fluorinated polymer includes a repeating unit having an acid labile group.

3. A top coat composition as claimed in claim 1, further comprising an organic solvent.

4. A top coat composition as claimed in claim 3, wherein the organic solvent is formed of one kind or two or more kinds of organic solvents selected from the group consisting of cyclic or chain hydrocarbons having 5 to 20 carbon atoms, alcohols having 1 to 20 carbon atoms and cyclic or chain hydrocarbons partially substituted with fluorine.

5. A top coat composition as claimed in claim 3, wherein the organic solvent is a solvent obtained by mixing 50% to lower than 99.9% of hydrocarbons having 5 to 20 carbon atoms and 0.1% to lower than 50% of alcohols having 1 to 20 carbon atoms.

6. A top coat composition as claimed in claim 1, wherein the top coat composition is used for immersion lithography.

7. A top coat for producing a semiconductor device, comprising:
a top coat composition as claimed in claim 1.

8. A semiconductor device comprising a top coat as claimed in claim 7.

* * * * *